(12) United States Patent
Takahashi et al.

(10) Patent No.: US 10,366,985 B2
(45) Date of Patent: Jul. 30, 2019

(54) SEMICONDUCTOR DEVICE HAVING A SENSE IGBT FOR CURRENT DETECTION OF A MAIN IGBT

(71) Applicant: Renesas Electronics Corporation, Koutou-ku, Tokyo (JP)

(72) Inventors: Yukio Takahashi, Ibaraki (JP); Hitoshi Matsuura, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 19 days.

(21) Appl. No.: 15/600,729

(22) Filed: May 20, 2017

(65) Prior Publication Data
US 2018/0040612 A1 Feb. 8, 2018

(30) Foreign Application Priority Data
Aug. 3, 2016 (JP) .................................. 2016-153040

(51) Int. Cl.
| | | |
|---|---|---|
| *H01L 29/739* | (2006.01) | |
| *H01L 27/082* | (2006.01) | |
| *H01L 27/088* | (2006.01) | |
| *H01L 29/423* | (2006.01) | |
| *H01L 29/06* | (2006.01) | |
| *H01L 29/40* | (2006.01) | |
| *H01L 29/10* | (2006.01) | |

(52) U.S. Cl.
CPC ........ *H01L 27/0825* (2013.01); *H01L 27/088* (2013.01); *H01L 29/0623* (2013.01); *H01L 29/0696* (2013.01); *H01L 29/404* (2013.01); *H01L 29/407* (2013.01); *H01L 29/4236* (2013.01); *H01L 29/4238* (2013.01); *H01L 29/7397* (2013.01); *H01L 29/1095* (2013.01)

(58) Field of Classification Search
CPC ............ H01L 29/0696; H01L 29/0804; H01L 29/1004; H01L 29/1095; H01L 29/41708; H01L 29/4236; H01L 29/739; H01L 29/7393–7398; H01L 29/7841; H01L 27/0716; H01L 27/082–0828
See application file for complete search history.

(56) References Cited

U.S. PATENT DOCUMENTS

| | | | |
|---|---|---|---|
| 8,581,299 B2 * | 11/2013 | Tsujiuchi | .............. H01L 27/082 257/140 |
| 8,633,510 B2 | 1/2014 | Matsuura et al. | |
| 9,041,050 B2 | 5/2015 | Matsuura | |

(Continued)

FOREIGN PATENT DOCUMENTS

| | | |
|---|---|---|
| JP | 2012-256839 A | 12/2012 |
| JP | 2013-140885 A | 7/2013 |

*Primary Examiner* — Maliheh Malek
(74) *Attorney, Agent, or Firm* — Shapiro, Gabor and Rosenberger, PLLC

(57) ABSTRACT

To improve current detection performance of a sense IGBT particularly in a low current region in a semiconductor device equipped with a main IGBT and the sense IGBT used for current detection of the main IGBT.
At a peripheral portion located at an outermost periphery of an active region surrounded by a dummy region within a sense IGBT cell, an $n^+$-type semiconductor region is formed over an upper surface of a well of a floating state adjacent to a trench gate electrode embedded into a trench at an upper surface of a semiconductor substrate and applied with a gate voltage.

14 Claims, 25 Drawing Sheets

(56) References Cited

U.S. PATENT DOCUMENTS

| | | | | |
|---|---|---|---|---|
| 9,153,673 B2* | 10/2015 | Tsujiuchi | ............ | H01L 29/7393 |
| 9,236,461 B2* | 1/2016 | Hikasa | ................ | H01L 29/7397 |
| 9,659,901 B2* | 5/2017 | Hikasa | .................... | H01L 29/16 |
| 9,748,370 B2* | 8/2017 | Kumada | ............ | H01L 29/7397 |
| 9,786,771 B2* | 10/2017 | Matsuura | ............ | H01L 29/7397 |
| 9,865,728 B2* | 1/2018 | Soeno | ................ | H01L 29/0619 |
| 9,876,092 B2* | 1/2018 | Hikasa | .................... | H01L 29/16 |
| 9,941,396 B2* | 4/2018 | Matsuura | ............ | H01L 29/7397 |
| 10,090,297 B2* | 10/2018 | Hikasa | ................ | H01L 29/7397 |
| 10,128,359 B2* | 11/2018 | Tsujiuchi | ............ | H01L 29/7395 |
| 2011/0291241 A1* | 12/2011 | Yoshikawa | ......... | H01L 29/0619 |
| | | | | 257/544 |
| 2012/0043581 A1* | 2/2012 | Koyama | ............ | H01L 29/0696 |
| | | | | 257/140 |
| 2012/0112241 A1* | 5/2012 | Matsushita | ......... | H01L 29/7397 |
| | | | | 257/139 |
| 2015/0263144 A1* | 9/2015 | Misu | .................... | H01L 29/407 |
| | | | | 257/139 |
| 2015/0270387 A1* | 9/2015 | Kumada | ............ | H01L 29/7397 |
| | | | | 257/140 |
| 2015/0325558 A1* | 11/2015 | Hikasa | .................... | H01L 29/16 |
| | | | | 257/49 |
| 2015/0380401 A1* | 12/2015 | Ishii | ........................ | H01L 21/76 |
| | | | | 257/140 |
| 2016/0079369 A1* | 3/2016 | Ogura | ................. | H01L 27/0727 |
| | | | | 257/140 |
| 2016/0141400 A1* | 5/2016 | Takahashi | ........... | H01L 29/7397 |
| | | | | 257/140 |
| 2016/0211257 A1* | 7/2016 | Yoshida | ............ | H01L 29/42368 |
| 2017/0033206 A1* | 2/2017 | Matsuura | ............ | H01L 29/7397 |
| 2017/0054010 A1* | 2/2017 | Matsuura | ............ | H01L 29/7397 |
| 2017/0236916 A1* | 8/2017 | Hikasa | .................... | H01L 29/16 |
| | | | | 257/49 |
| 2017/0256634 A1* | 9/2017 | Matsuura | ............. | H01L 29/407 |
| 2017/0278956 A1* | 9/2017 | Tsuyuki | ................ | H01L 29/407 |
| 2018/0138170 A1* | 5/2018 | Hosokawa | .......... | H01L 27/0727 |
| 2018/0145134 A1* | 5/2018 | Nagata | ............. | H01L 29/0696 |
| 2018/0261594 A1* | 9/2018 | Yamano | ............. | H01L 27/0664 |
| 2018/0269202 A1* | 9/2018 | Yamano | ............. | H01L 27/0664 |
| 2018/0350910 A1* | 12/2018 | Saito | .................... | H01L 29/0696 |

* cited by examiner

SEMICONDUCTOR DEVICE HAVING A SENSE IGBT FOR CURRENT DETECTION OF A MAIN IGBT

CROSS-REFERENCE TO RELATED APPLICATIONS

The disclosure of Japanese Patent Application No. 2016-153040 filed on Aug. 3, 2016 including the specification, drawings and abstract is incorporated herein by reference in its entirety.

BACKGROUND

The present invention relates to a semiconductor device, and is suitably available for, for example, a semiconductor device having a sense IGBT for current detection of a main IGBT.

A trench gate electrode type IGBT (Insulated Gate Bipolar Transistor) low in channel resistance and small in loss has a silicon substrate included of three layers of a p-type collector layer, a low resistance n-type buffer layer, and a high resistance n-type drift layer, a p-type base layer formed over the upper surface of the n-type drift layer, and a plurality of trenches adjacent to the p-type base layer and formed in the upper surface of the silicon substrate. A trench gate electrode insulated from the silicon substrate is provided in each of the trenches. The side wall of the trench is used as a channel of a transistor.

Further, it has been known that as an element detecting a current of a main IGBT mounted on a semiconductor chip, a sense IGBT (sub IGBT) included of a sensing current detection cell is mounted onto the semiconductor chip.

A structure of an IE (Injection Enhancement) type trench IGBT has been described in Patent Document 1 (Japanese Unexamined Patent Application Publication Laid-Open No. 2012-256839).

Further, respective IGBTs of a GGEE type and an EGE type have been described in Patent Document 2 (Japanese Unexamined Patent Application Publication Laid-Open No. 2013-140885).

SUMMARY

In a trench type IGBT, positive holes are accumulated in a p-type region of a floating state adjacent to a trench gate electrode to thereby promote conductivity modulation, thus reducing an on voltage. On the other hand, there is a case where since the positive holes are hard to be stored in the p-type region in an outermost peripheral sense IGBT of a sense IGBT cell in which a plurality of sense IGBTs are arranged side by side, an on voltage is not lowered, and a sense IGBT is not operated particularly in a low current region. In this case, a problem arises in that it is not possible to detect a current of a main IGBT by using the sense IGBT.

Other objects and novel features of the present invention will become apparent from the description of the present specification and the accompanying drawings.

A summary of a typical one of embodiments disclosed in the present application will be described in brief as follows:

A semiconductor device according to one aspect of the present invention is adapted to have an $n^+$-type semiconductor region over an upper surface of a p-type well of a floating state, which is adjacent to trench gate electrodes at a peripheral portion at an outermost periphery of an active region, of a sense IGBT cell for current detection of a main IGBT cell.

According to one aspect of the present invention, it is possible to improve the performance of a semiconductor device.

DETAILED DESCRIPTION

Figure 1:
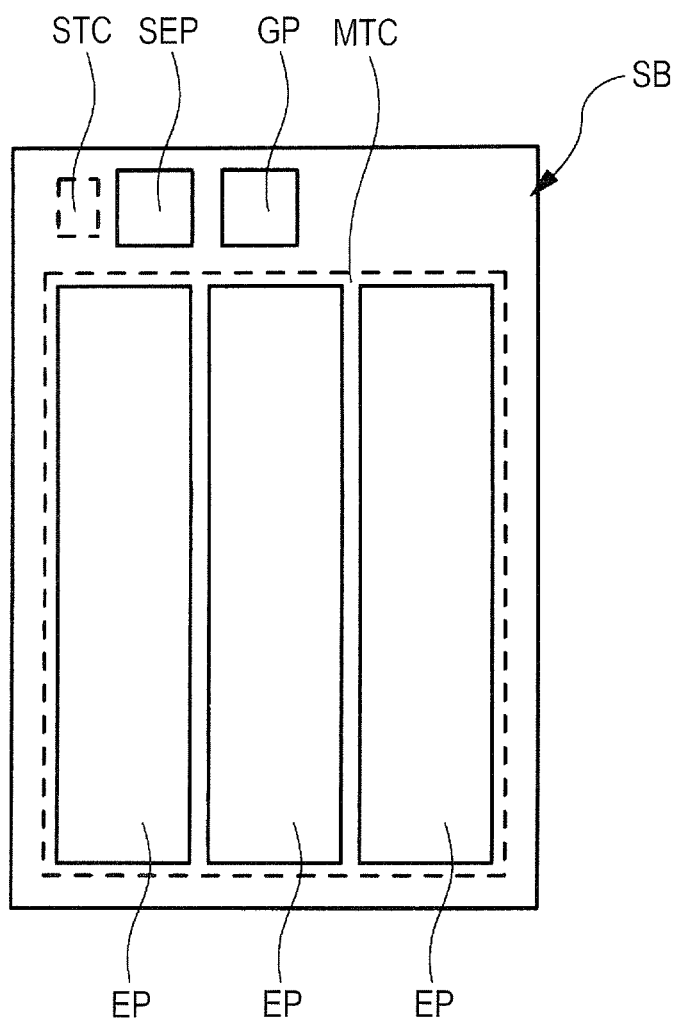
FIG. 1 is a plan diagram showing a semiconductor device according to an embodiment 1 of the present invention.

Embodiments will hereinafter be described based on the accompanying drawings. Incidentally, in all of the drawings for explaining the embodiments, the same reference numerals are respectively attached to components having the same function, and their repetitive description will be omitted. Further, in the following embodiments, the description of the same or like components will not be repeated in principle except for when required in particular.

Further, symbols "−" and "+" respectively indicate a relative concentration of an impurity whose conductivity type is an n type or a p type. In the case of the n-type impurity, for example, an impurity concentration becomes high in order of "n−", "n", and "n+".

Embodiment 1

<Structure of Semiconductor Device>

Figure 4:
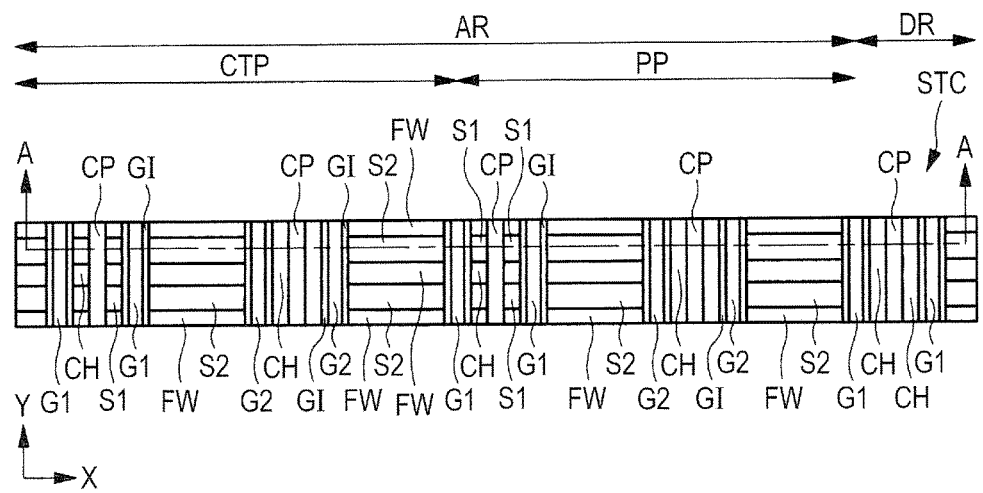
FIG. 4 is a plan diagram showing the sense IGBT cell which configures the semiconductor device according to the embodiment 1 of the present invention.
Figure 5:
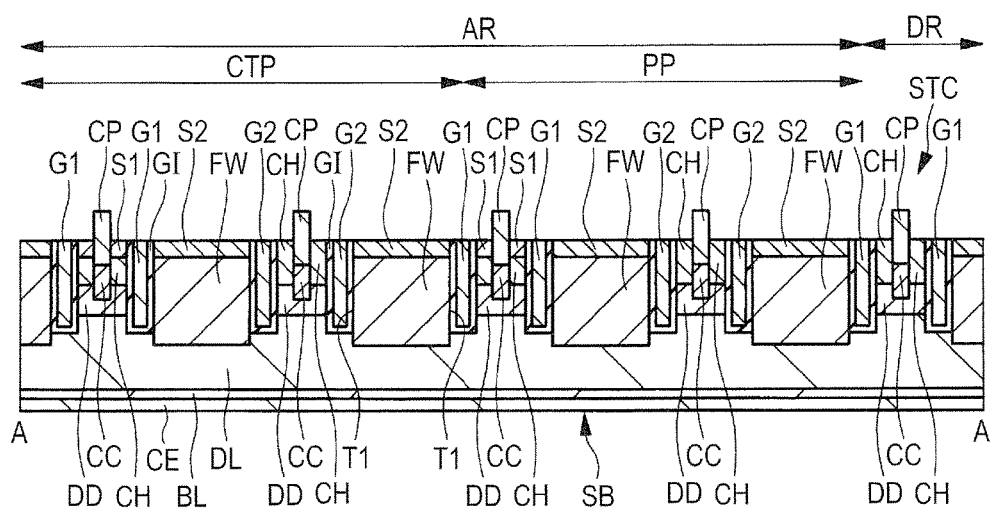
FIG. 5 is a sectional diagram taken along line A-A of FIG. 4.
Figure 6:
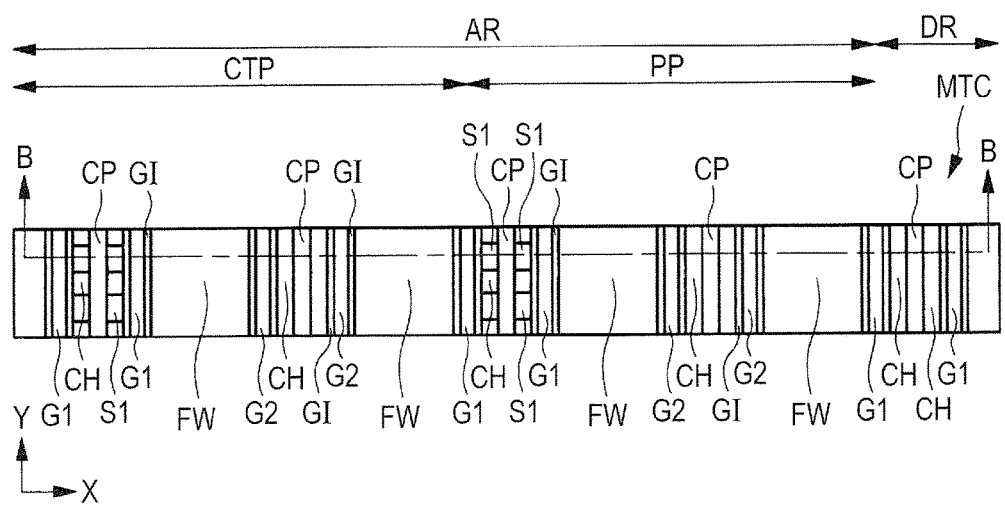
FIG. 6 is a plan diagram showing the main IGBT cell which configures the semiconductor device according to the embodiment 1 of the present invention.
Figure 7:
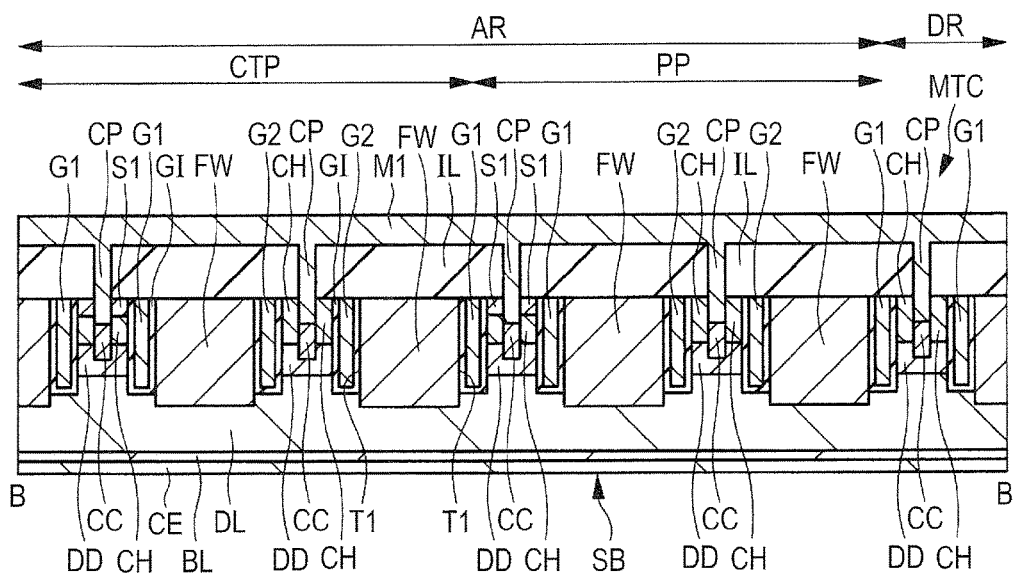
FIG. 7 is a sectional diagram taken along line B-B of FIG. 6.

A structure of a semiconductor device according to the present embodiment will hereinafter be described using FIGS. 1 through 7. FIGS. 1 through 4 and FIG. 6 are respectively plan diagrams of the semiconductor device according to the present embodiment. FIGS. 5 and 7 are respectively sectional diagrams of the semiconductor device according to the present embodiment. FIG. 5 is a sectional diagram taken along line A-A of FIG. 4, and FIG. 7 is a sectional diagram taken along line B-B of FIG. 6.

In FIGS. 4 through 7, an active region (energizing region) AR and a dummy region DR are shown to be arranged in order from the left side. Further, the active region AR is included of a central portion CTP and a peripheral portion PP arranged in order from the left side in the drawings.

The present application relates to a semiconductor device equipped with a main IGBT used as a switching element or the like and a sense IGBT used to detect a current of the main IGBT. The invention of the present application is adapted to realize an improvement in the performance of current detection of the main IGBT by the sense IGBT by providing an n-type semiconductor region over an upper surface of a floating well formed between trenches in a substrate main surface of the sense IGBT, as will be described below.

A plan diagram of a semiconductor chip CHP being the semiconductor device according to the present embodiment is shown in FIG. 1. As illustrated in FIG. 1, the semiconductor chip CHP has a semiconductor substrate SB. A main IGBT cell MTC being a region in which transistors (IGBTs) each configuring a main IGBT are arranged side by side in plural form, and a sense IGBT cell STC being a region in which transistors (IGBTs) each configuring a sense IGBT are arranged side by side in plural form exist in a main surface of the semiconductor substrate SB to be apart from each other.

Emitter pads EPs each electrically coupled to an emitter electrode of the main IGBT are formed over the main surface of the semiconductor substrate SB in the main IGBT cell MTC. Also, an emitter pad SEP electrically coupled to an emitter electrode of the sense IGBT is formed over the main surface of the semiconductor substrate SB in a region adjacent to the sense IGBT cell STC. Further, a gate pad GP electrically coupled to gate electrodes of both the main IGBT and the sense IGBT is formed over the main surface of the semiconductor substrate SB in a region adjacent to the emitter pad SEP. Still further, although not shown in the drawing, collector electrodes of both the main IGBT and the sense IGBT are formed over a back surface on the side opposite to the main surface of the semiconductor substrate SB.

The IGBT which is of the semiconductor device according to the present embodiment is an IGBT with current sense having a structure of preventing destruction of the main IGBT due to an overcurrent. The IGBT with the current sense has a main IGBT cell MTC through which a main current flows. Further, the IGBT being the semiconductor device according to the present embodiment has a sense IGBT cell STC being coupled to the main IGBT cell MTC and being a sensing current detection cell whose effective area is about 1/1000 of that of the main IGBT cell MTC.

In this case, when a main current of 100 A flows through the main IGBT cell MTC, a current of 0.1 A equivalent to 1/1000 of 100 A flows through the sense IGBT cell STC. That is, the IGBT with the current sense detects a current flowing through the sense IGBT cell STC in proportion to the main current as a sub-current (sense current). That is, the sense IGBT cell STC being a sub element group included of a plurality of sense IGBTs is used for detecting a main current flowing through the main IGBT cell MTC being a main element group included of a plurality of main IGBTs in an active region (main-conducting region) of the main IGBT cell MTC, based on the sub-current (sense current) flowing through an active region (sub-conducting region) of the sense IGBT cell STC. Since the number of elements in the sub element group is smaller than the number of elements in the main element group, and the active region for the sub element group is smaller than the active region for the main element group, a saturation current of the sub-current flowing through the sub-energizing region is smaller than a saturation current of the main current flowing through the main-energizing region.

Then, when an overcurrent flows through the sense IGBT cell STC due to a short-circuit or the like, an overcurrent is considered to flow even in the main IGBT. Therefore, the main IGBT cell MTC can be protected from destruction due to the overcurrent by applying feedback to the main IGBT cell MTC through a gate signal.

The contours of the main IGBT cell MTC and the sense IGBT cell STC are respectively indicated by broken lines in FIG. 1. The ratio between the area of the sense IGBT cell STC indicated by the broken line and the area of the main IGBT cell MTC indicated by the broken line is about 1:1000. In principle, the present area ratio becomes a sense ratio between a main current flowing between the emitter and collector of the main IGBT cell MTC and a sub-current (sense current) flowing between the emitter and collector of the sense IGBT cell STC. Incidentally, the area ratio between the sense IGBT cell STC and the main IGBT cell MTC may be set as ratios different in a range of 1:100 to 10000, for example.

Figure 2:
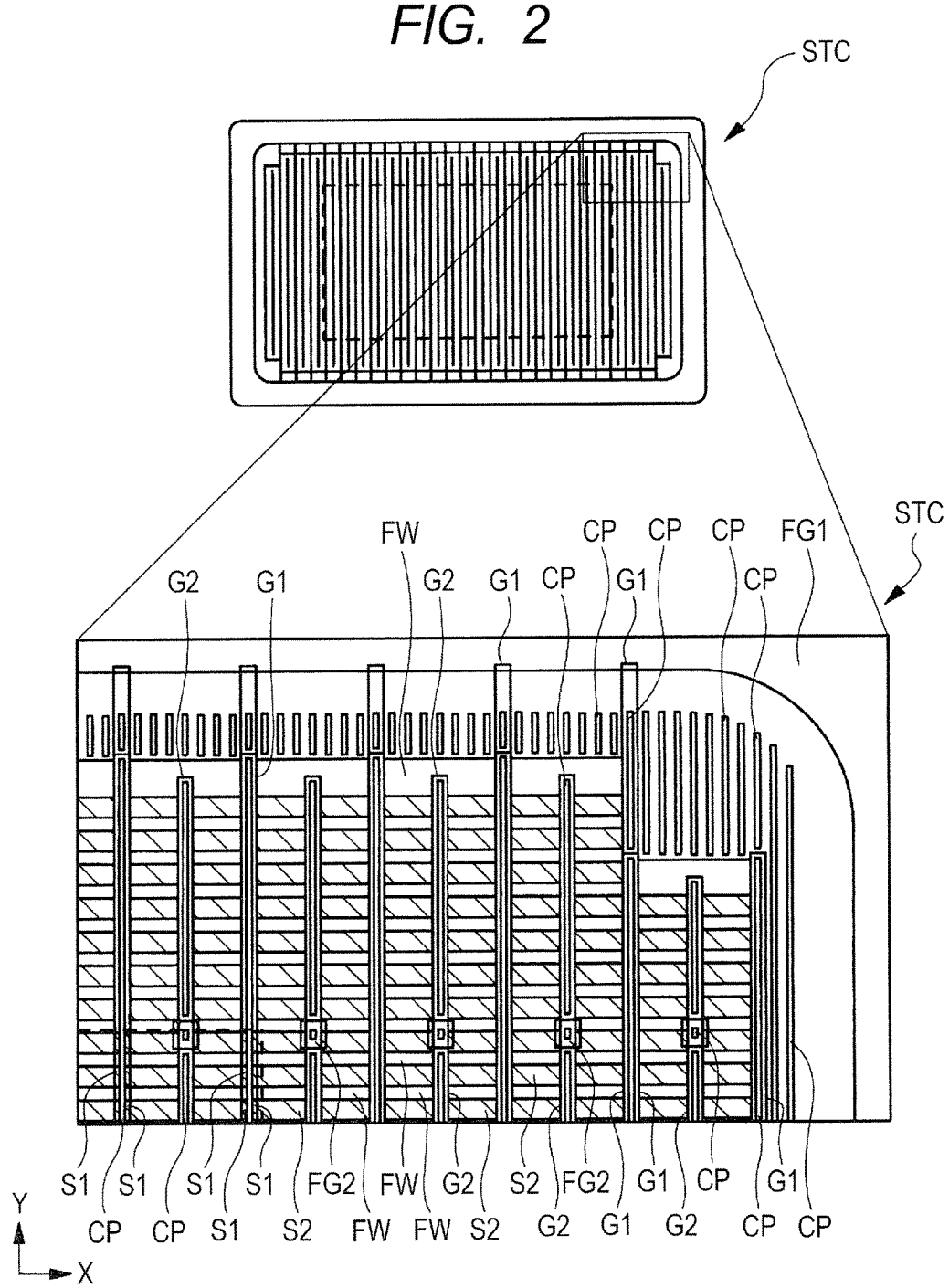
FIG. 2 is a plan diagram showing a sense IGBT cell which configures the semiconductor device according to the embodiment 1 of the present invention.
Figure 3:
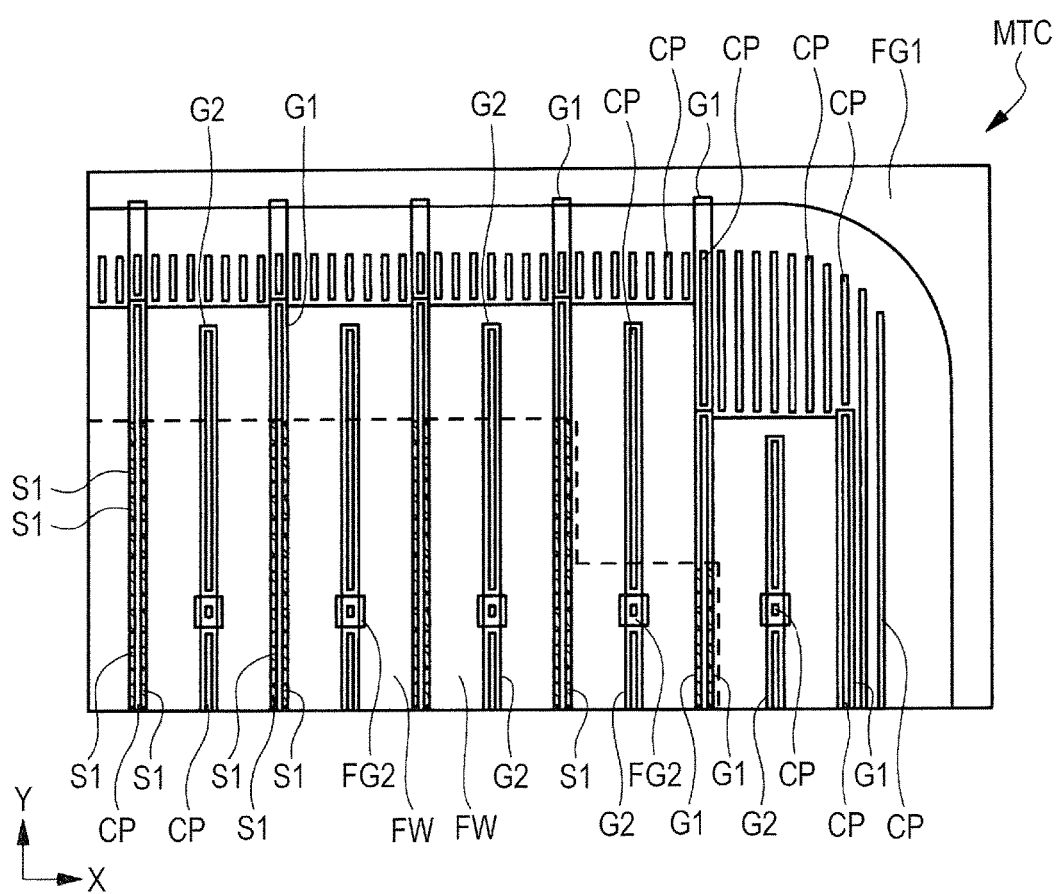
FIG. 3 is a plan diagram showing a main IGBT cell which configures the semiconductor device according to the embodiment 1 of the present invention.

The above area ratio is specifically an area ratio as viewed in plan view between the active region (sub-energizing region) of the sense IGBT cell STC surrounded by the broken line in FIG. 2 and the active region (main-energizing region) of the main IGBT cell MTC surrounded by the broken line in FIG. 3. That is, the area ratio between the sub-energizing region and the main-energizing region is 1:1000, for example. The area of the sub-energizing region is smaller than the area of the main-energizing region.

Next, an enlarged plan diagram of the sense IGBT cell STC indicated by the broken line in FIG. 1 is shown in FIG. 2. A plane layout of the sense IGBT cell STC is shown in FIG. 2 with the direction of the plan diagram being shifted as compared with FIG. 1. Further, a plane layout of the entire sense IGBT cell STC and a plane layout showing the vicinity of the corner of the corresponding plane layout in an enlarged form are shown side by side in FIG. 2. Incidentally, in order to make it easy to understand the drawings, emitter electrodes S1 and $n^+$-type semiconductor regions S2 are respectively hatched in FIG. 2.

As shown in FIG. 2, a trench gate electrode G1 is formed within a trench formed in the main surface of the semiconductor substrate through a gate insulating film (no shown), and a trench gate electrode G2 is formed within another trench formed in the main surface of the semiconductor substrate through the gate insluting film (not shown). The trench gate electrodes G1 and G2 respectively extend in a Y direction extending along the main surface of the semiconductor substrate. Further, two trench gate electrodes G1 and two trench gate electrodes G2 are alternately arranged side by side in an X direction orthogonal to the Y direction. That is, a plurality of trenches are formed side by side in a stripe form in the main surface of the semiconductor substrate. Incidentally, the X direction corresponds to a direction extending along the main surface of the semiconductor substrate. The trench gate electrodes G1 and G2 are respectively included of a polysilicon film. Further, since the trench gate electrodes G1 and G2 are small in width, the trench gate electrodes G1 and G2 are respectively shown in a linear form in FIG. 2.

Channel regions CH each being a p-type semiconductor region and emitter electrodes S1 each being an $n^+$-type semiconductor region are alternately formed side by side in the Y direction at the upper surface of the semiconductor substrate between the trench gate electrodes G1 adjacent to each other. Here, no emitter electrode S1 is formed in part of the upper surface of the channel region CH because there is a fear that when the emitter electrode S1 is formed in the entire upper surface of the semiconductor substrate SB between the adjacent trench gate electrodes G1, an excessive current instantaneously flows at the time of a short-circuit or the like, so that the IGBT is destroyed. Incidentally, the width of each emitter electrode S1 in the Y direction is 1.0 µm, for example, and the distance between the emitter electrodes S1 adjacent to each other in the Y direction is 0.44 µm, for example.

A contact plug (coupling portion) CP electrically coupled to each emitter electrode S1 extends in the Y direction at the central portion between the trench gate electrodes G1 adjacent to each other. That is, the contact plug CP is interposed between the two emitter electrodes S1 in the X direction.

However, the emitter electrodes S1 are formed only in the active region excluding the dummy region, of the sense IGBT cell STC. In FIG. 2, the contour of the active region is indicated by a broken line.

The channel region CH as the p-type semiconductor region is formed at the upper surface of the semiconductor substrate between the trench gate electrodes G2 adjacent to each other, and no emitter electrode S1 is formed thereat. Further, the contact plug CP extending in the Y direction is coupled to the upper surface of the semiconductor substrate between the trench gate electrodes G2 adjacent to each other.

The trench gate electrode G1 extends to the end of the sense IGBT cell STC in the Y direction and is electrically coupled integrally to a silicon layer FG1 formed over the semiconductor substrate at the end thereof. That is, the silicon layer FG1 is included of the same film as a silicon film which configures the trench gate electrode G1 in each trench formed in the main surface of the semiconductor substrate. The silicon layer FG1 is formed over the semiconductor substrate unlike the trench gate electrode G1. The trench gate electrode G1 is supplied with a gate voltage through the silicon layer FG1.

Further, contact plugs CP extending in the Y direction are arranged in plural form between the trench gate electrodes G1 and G2 and the silicon layer FG1 in plan view.

Moreover, the trench gate electrode G2 is electrically coupled integrally to a silicon layer FG2 formed over the semiconductor substrate within a region surrounded by the silicon layer FG1 in plan view. That is, the silicon layer FG2 is included of the same film as a silicon film which configures the trench gate electrode G2 in each trench fainted in the main surface of the semiconductor substrate. The silicon layer FG2 is formed over the semiconductor substrate unlike the trench gate electrode G2. The trench gate electrode G2 is supplied with an emitter voltage through the silicon layer FG2. That is, the trench gate electrode G2 and the emitter electrode S1 become the same potential.

Thus, a part of the trench gate electrodes is set to the emitter voltage without applying the gate voltage to all of the trench gate electrodes formed in the main surface of the semiconductor substrate to greatly reduce a gate capacitance, thereby enabling a high-speed operation, whereby a switching loss is greatly reduced. When the IGBT is in an on state, the discharge paths of holes (positive holes) to the emitter electrode side (main surface side) are limited to a narrow path interposed between the trench gate electrodes G1 adjacent to each other and a narrow path interposed between the trench gate electrodes G2 adjacent to each other. Thus, since the discharge of the holes is limited, it is possible to enhance the concentration of electric charges accumulated in a drift region. Thus, the effect of further promoting conductivity modulation is called an IE (Injection Enhancement) effect. With this effect, an on voltage of each IGBT is reduced. The corresponding sense IGBT shown in FIG. 2 is an IE type trench gate IGBT.

Further, the sense IGBT shown in FIG. 2 is called a GGEE type (gate-gate-emitter-emitter type) because the two trench gate electrodes G1 to which the gate voltage is applied, and the two trench gate electrodes G2 to which the emitter voltage is applied are alternately arranged in the X direction.

The above-described dummy region is a region between the region (active region) surrounded by the broken line and the silicon layer FG1 in each of the two plan diagrams shown in FIG. 2. Although trench gate electrodes G1 and G2 and contact plugs CP are formed even in the dummy region similarly to the active region, the dummy region is different from the active region and no emitter electrode S1 is formed in the main surface of the semiconductor substrate in the dummy region. That is, the dummy region is a region in which a pseudo IGBT which does not function as the IGBT is formed. The dummy region is a non-energizing region made non-conductive upon the operation of the sense IGBT. That is, the IGBT in the dummy region does not configure a circuit.

Also, the active region is a region formed with the sense IGBT including the emitter electrodes S1. That is, the active region is an energizing region made conductive upon the operation of the sense IGBT. Incidentally, the active region of the sense IGBT shown in FIG. 2 may be called a sub-energizing region as compared with the energizing region (main energizing region) of the main IGBT shown in FIG. 3. Further, the active region is distinguished into the central portion of the active region in plan view and the peripheral portion surrounding the central portion.

Further, as shown in the enlarged plan diagram on the lower side of FIG. 2, wells FW each being a p-type semiconductor region and $n^+$-type semiconductor regions S2 are alternately formed side by side in the Y direction in the main surface of the semiconductor substrate between the trench gate electrode G1 and the trench gate electrode G2 adjacent to each other in the X direction. The $n^+$-type semiconductor regions S2 are formed even in both of the active region and the dummy region and formed even in both of the central portion and the peripheral portion within the active region. Each of the wells FW and the $n^+$-type semiconductor regions S2 is a semiconductor region of a floating state, which is not electrically coupled even to both the contact plugs CP and electrode pads. The feature of the present embodiment resides in that the above $n^+$-type semiconductor region S2 is formed over the upper surface of the well FW at the peripheral portion of the active region of the sense IGBT.

Incidentally, the floating state mentioned in the present application means that a conductor layer or a semiconductor layer (semiconductor region) or the like indicates a layer (region) which is not electrically coupled to a potential-supplying coupling portion of each contact plug or electrode pad or the like and insulated from other electrodes or the like. There is also, however, a case in which an insulated state is released by the operation of a semiconductor element or the like and a current flows into a layer placed in a floating state. It is possible to accumulate electrical charges into the layer held in the floating state, for example.

A plane layout of the vicinity of the corner of the main IGBT cell MTC will next be described using FIG. 3. FIG. 3 is a diagram corresponding to the plan diagram on the lower side of FIG. 2. That is, FIG. 3 is an enlarged plan diagram showing a structure of the vicinity of the lower right corner of the main IGBT cell MTC shown by the broken line in FIG. 1 by changing its angle.

The main IGBT cell MTC has a structure approximately similar to the sense IGBT cell except that no $n^+$-type semiconductor region S2 is formed and the scale of the IGBT, i.e., the arranged number of cell units of the IGBTs is larger than that of the sense IGBT cell. That is, as shown in FIG. 3, the main IGBT cell MTC has trench gate electrodes G1 formed within trenches formed in the main surface of the semiconductor substrate through a gate insulating film (not shown) and extending in the Y direction, and trench gate electrodes G2 foamed within other trenches foamed in the main surface of the semiconductor substrate through the gate insulting film (not shown) and extending in the Y direction. Further, the two trench gate electrodes G1 and the two trench gate electrodes G2 are alternately arranged side by side in the X direction.

Also, channel regions CH each being a p-type semiconductor region, and emitter electrodes S1 each being an $n^+$-type semiconductor region are alternately formed side by side in the Y direction in the upper surface of the semiconductor substrate between the trench gate electrodes G1 adjacent to each other. Furthermore, contact plugs CP electrically coupled to the emitter electrodes S1 extend in the Y direction at the central portions between the trench gate electrodes G1 adjacent to each other. The emitter electrodes S1 are formed only in an active region excluding a dummy region within the main IGBT cell MTC. In FIG. 3, the contour of the active region is shown by a broken line.

Further, channel regions CH each being a p-type semiconductor region are formed in the upper surface of the semiconductor substrate between the trench gates electrodes G2 adjacent to each other, and no emitter electrode S1 is formed. Furthermore, contact plugs CP extending in the Y direction are coupled to the upper surface of the semiconductor substrate between the trench gate electrodes G2 adjacent to each other.

Each trench gate electrode G1 extends to the end of the main IGBT cell MTC in the Y direction and is electrically coupled integrally to a silicon layer FG1 formed over the semiconductor substrate at the end thereof. The trench gate electrode G1 is supplied with a gate voltage through the silicon layer FG1.

Also, contact plugs CP extending in the Y direction are arranged in plural form between the trench gate electrodes G1 and G2 and the silicon layer FG1 in plan view.

Further, each trench gate electrode G2 is electrically coupled integrally to a silicon layer FG2 formed over the semiconductor substrate within a region surrounded by the silicon layer FG1 in plan view. The trench gate electrode G2 is supplied with an emitter voltage through the silicon layer FG2. That is, the main IGBT is an IE type trench gate IGBT.

Besides, since the two trench gate electrodes G1 to which the gate voltage is applied, and the two trench gate electrodes G2 to which the emitter voltage is applied are arranged side by side in the X direction, the corresponding main IGBT is called a GGEE type (gate-gate-emitter-emitter type).

The dimension of each part of the IGBT in the main IGBT cell MTC is the same as that in the sense IGBT cell. For example, in the main IGBT cell MTC and the sense IGBT cell, the widths of the trench gate electrodes G1 and G2 and the distance between the trench gate electrodes adjacent to each other, and the width of the contact plug CP and the formed depth of each of the emitter electrode S1 and the channel region CH, etc. are the same as each other. That is, the main IGBT cell MTC is larger than the sense IGBT cell in terms of the number of IGBT cells by an area larger than that of the sense IGBT cell.

The above active region is a region formed with the main IGBT including the emitter electrodes S1. That is, the active region is an energizing region (main energizing region) made conductive upon the operation of the main IGBT.

The above-described dummy region is a region between the region (active region) surrounded by the broken line and the silicon layer FG1 in each of the two plan diagrams shown in FIG. 2. Unlike the sense IGBT cell, the width of the dummy region in the main IGBT cell MTC is small. That is, in the sense IGBT cell STC shown in FIG. 2, the dummy region has a broad width including the eight trench gate electrodes G1 and the eight trench gate electrodes G2 in the X direction, whereas in the main IGBT cell MTC shown in FIG. 3, the dummy region has a narrow width including the two trench gate electrodes G1 and the two trench gate electrodes G2 in the X direction. Even in the Y direction, the width of the dummy region of the sense IGBT cell STC shown in FIG. 2 is smaller than the width of the dummy region of the main IGBT cell MTC shown in FIG. 3.

In other word, as viewed in the X direction, the number of pseudo IGBTs arranged in the dummy region of the sense IGBT cell STC is larger than the number of pseudo IGBTs arranged in the dummy region of the main IGBT cell MTC.

The dummy region is provided in the main IGBT cell MTC because when the emitter electrode S1 is formed to the outermost periphery in the main IGBT cell MTC, the outermost peripheral IGBT is easy to cause breakdown as compared with the IGBT lying inwardly from the outermost periphery. Thus, in order to prevent the breakdown from occurring at the end of the main IGBT cell MTC, in the main IGBT cell MTC, only the IGBT in the region close to the central portion in the main IGBT cell MTC is made conductive and used, and the outermost peripheral cell in the main IGBT cell MTC is not provided with the emitter electrode S1 and not driven as the IGBT.

The reason why the dummy region is provided in the sense IGBT cell STC shown in FIG. 2 is because of preventing the breakdown of the IGBT and adjusting the sense ratio according to the request as described above. That is, the sense ratio between the main IGBT and the sense IGBT is determined by the size ratio between the area of the active region of the sense IGBT cell STC surrounded by the broken line shown in FIG. 2 and the area of the active region of the main IGBT cell MTC surrounded by the broken line shown in FIG. 3. In the present embodiment, as an example, the ratio between the area of the active region of the sense IGBT cell STC and the area of the active region of the main IGBT cell MTC is set to be 1:1000. When a current of the main IGBT is detected using the sense IGBT, the current of the main IGBT can be calculated by setting a current value of the sense IGBT to 1000 times.

Here, there is a case where there is a request to design a semiconductor device equipped with a sense IGBT and a main IGBT having a sense ratio of 1:500, for example after a semiconductor device equipped with a sense IGBT and a main IGBT having the corresponding area ratio, i.e. sense ratio, e.g., 1:1000 is designed. In this case, as shown in FIG. 2, if the dummy region of the sense IGBT cell STC is provided with a broad width when the semiconductor device whose sense ratio is 1:1000 is designed, the active region of the sense IGBT cell STC can be made wide correspondingly by changing the design of forming the emitter electrode S1 between the adjacent trench gate electrodes G1 in some IGBTs of the dummy region. That is, the sense ratio can be design-changed from 1:1000 to 1:500 by designing/changing a part of the pseudo cells in the dummy region as the active region and making the area of the active region of the sense IGBT cell STC two times, for example.

Thus, if the dummy region of the sense IGBT cell STC is ensured large, the semiconductor devices different in sense ratio from each other can be formed only by changing the formation range of the emitter electrode S1 being the $n^+$-type semiconductor region. Thus, it is possible to manufacture the semiconductor devices different in sense ratio from each other in an early stage and at a low cost. Due to such reasons, the sense IGBT cell STC is provided larger in dummy region than the main IGBT cell MTC (refer to FIG. 3).

Further, as shown in FIG. 3, only the well FW being the p-type semiconductor region is formed in the main surface of the semiconductor substrate between the trench gate electrode G1 and the trench gate electrode G2 both adjacent to each other in the X direction, and no $n^+$-type semiconductor region S2 (refer to FIG. 2) is formed. No $n^+$-type semiconductor region S2 is formed even in both the active region and the dummy region. The well FW is a semiconductor region of a floating state, which is not coupled to the contact plugs CP or electrode pads.

The structure of the IGBT formed in the sense IGBT cell STC will next be described in detail using FIGS. 4 and 5. A part extending from the dummy region to the central portion of the active region, of the sense IGBT cell STC shown in FIG. 2 is shown in an enlarged form in FIGS. 4 and 5. Incidentally, the illustration of an interlayer insulating film over the semiconductor substrate SB and a wiring above each contact plug CP is omitted in FIGS. 4 and 5.

Further, in FIG. 5, of the active region AR, a central portion CTP of the active region AR in plan view, and a peripheral portion PP surrounding the central portion CTP within the active region AR are distinguished from each other. The peripheral portion PP is a ring-shaped region which corresponds to the end of the active region AR and surrounds the central portion CTP in plan view. That is, the central portion CTP is a region located on the central portion side of the active region AR than the peripheral portion PP in plan view.

The peripheral portion PP in the X direction indicates, for example, a region from a trench gate electrode G1 on the active region AR side, of two trench gates electrodes G1 formed at the end on the active region AR side of the dummy region DR to the second trench gate electrode G1 existing toward the central portion CTP. That is, at least two wells FW, two trench gate electrodes G2, one trench gate electrode G1, and two emitter electrodes S1 are formed in the peripheral portion PP.

As shown in FIG. 5, a collector electrode CE being a $p^+$-type semiconductor region formed over the back surface of the semiconductor substrate SB, a buffer layer BL being an n-type semiconductor region which comes into contact with an upper surface of the collector electrode CE, and a drift layer (drift region) DL being an $n^-$-type semiconductor region over the buffer layer BL are fainted within the semiconductor substrate SB. Trenches T1 which reach a depth on the way of the drift layer DL and does not reach up to the buffer layer BL are formed in the main surface of the semiconductor substrate SB side by side in plural form in the X direction. Each trench T1 extends in the Y direction, and each trench gate electrode G1 or G2 is embedded inside the trench T1 through a gate insulating film GI.

When the trench gate electrode G1 is formed within a predetermined trench T1, the trench gate electrode G1 is formed within one of two trenches T1 interposing the corresponding trench T1 therebetween, and the trench gate electrode G2 is formed within the other thereof. Further, when the trench gate electrode G2 is formed within a predetermined trench T1, the trench gate electrode G2 is formed within one of two trenches T1 interposing the corresponding trench T1 therebetween, and the trench gate electrode G1 is formed within the other thereof.

In the active region AR, emitter electrodes S1 are formed at the upper surface between the trench gate electrodes G1 adjacent to each other. A p-type channel region CH and an n-type semiconductor region DD are formed in order below the emitter electrode S1. That is, the channel region CH is formed directly below the emitter electrode S1 within the semiconductor substrate SB adjacent to the trench T1. p-type channel regions CH are formed in the main surface of the semiconductor substrate SB between the trench gate electrodes G1 adjacent to each other in the dummy region DR and between the trench gate electrodes G2 adjacent to each other in the active region AR and the dummy region DR respectively, and n-type semiconductor regions DD are formed below the channel regions CH, but no emitter electrode S1 is formed in the corresponding main surface. In any of the n-type semiconductor regions DD, its formed depth is shallower than the bottom face of the trench T1.

Further, in the active region AR and the dummy region DR, an $n^+$-type semiconductor region S2 is formed at the upper surface of the semiconductor substrate SB between the trench gate electrode G1 and the trench gate electrode G2 adjacent to each other, and a well FW is formed below the $n^+$-type semiconductor region S2. The formed depth of the well FW is deeper than the bottom face of the trench T1 and shallower than the bottom face of the drift layer DL. Further, as shown in FIG. 4, the $n^+$-type semiconductor region S2 and the well FW are alternately arranged in the Y direction. That is, the $n^+$-type semiconductor region S2 is formed at a part of the upper surface of the well FW, and the well FW and the $n^+$-type semiconductor region S2 are in contact with each other.

The emitter electrode S1 and the $n^+$-type semiconductor region S2 are arranged side by side each other in the X direction. In other words, the emitter electrode S1 and the $n^+$-type semiconductor region S2 are arranged in the X direction so as to interpose the trench T1 and the trench gate electrode G1 therebetween. This is because with a view to obtaining the effect of the semiconductor device according to the present embodiment to be described later, electrons supplied from the emitter electrode S1 are made to flow into the collector electrode CE through the well FW and the $n^+$-type semiconductor region S2.

Thus, the emitter electrode S1 is formed in the main surface of the semiconductor substrate SB adjacent to the trench T1 and the trench gate electrode G1 in the lateral direction (X direction) of the trench T1 and the trench gate electrode G1. Further, the well FW and the $n^+$-type semiconductor region S2 are formed in the main surface of the semiconductor substrate SB adjacent to the trench T1 and the trench gate electrode G1 on the opposite side of the emitter electrode S1 in the lateral direction (X direction) of the trench T1 and the trench gate electrode G1.

In the active region AR and the dummy region DR, trenches are formed in the upper surface of the semiconductor substrate SB between the trench gate electrodes G1 adjacent to each other and between the trench gate electrodes G2 adjacent to each other respectively. Parts of the contact plugs CP are embedded into the trenches. The contact plugs CP extend above the main surface of the semiconductor substrate SB from within the trenches. Although not shown in the drawings, an interlayer insulating film included principally of, for example, a silicon oxide film is formed over the main surface of the semiconductor substrate SB, and wirings coupled integrally to the respective contact plugs CP extend over the interlayer insulating film in the X and Y directions.

Incidentally, although no emitter electrodes S1 are formed between the trench gate electrodes G2 adjacent to each other, the contact plug CP is coupled therebetween. In other words, the contact plug CP is coupled to the main surface of the semiconductor substrate SB adjacent to the trench gate electrode G2 in the X direction on the opposite side of the well FW between the trench gate electrode G1 and the trench gate electrode G2 adjacent to each other.

As shown in FIG. 5, a $p^+$-type semiconductor region CC is foamed in the surface of the semiconductor substrate SB which is in contact with the bottom face of the contact plug CP. The $p^+$-type semiconductor region CC does not contact with the trench T1. The position of the upper surface of the $p^+$-type semiconductor region CC is deeper than the bottom face of the emitter electrode S1, and the position of the bottom face of the $p^+$-type semiconductor region CC is shallower than the bottom face of the n-type semiconductor region DD. That is, the $p^+$-type semiconductor region CC is formed from the bottom face of the contact plug CP to a depth on the way of the n-type semiconductor region DD. Incidentally, in an unillustrated region, a contact plug is coupled to the upper surface of each of the silicon layers FG1 and FG2 (refer to FIG. 2), and the corresponding contact plug does not reach the main surface of the semiconductor substrate SB.

In the active region AR, the emitter electrode S1 and the contact plug CP are electrically coupled through their mutual side walls.

The semiconductor substrate SB is included of, for example, single crystal silicon. The gate insulating film GI is included of, for example, a silicon oxide film. Further, each of the trench gate electrodes G1 and G2 is included of, for example, a polysilicon film. The n-type semiconductor region of the respective semiconductor regions in the semiconductor substrate SB is a region fainted by introducing an n-type impurity (e.g., P (phosphorus)) into the semiconductor substrate SB, and the p-type semiconductor region is a region formed by introducing a p-type impurity (e.g., B (boron)) into the semiconductor substrate SB. The contact plug CP is included of a barrier metal film which covers its side and bottom faces, and a main conductor film (e.g., Al (aluminum) film). An impurity concentration of the drift layer DL is, for example, $1 \times 10^{14}$ cm$^3$.

One cell (unit cell) of the sense IGBT in the active region AR shown in FIG. 5 has at least the trench gate electrode G1, the emitter electrode S1, the channel region CH, and the collector electrode CE. Further, the unit cells repeatedly arranged in the active region AR respectively have the two trench gate electrodes G1, the well FW, the two trench gate electrodes G2, and the well FW arranged in order in the X direction. The two trench gate electrodes G1 respectively configure the above unit cell of the sense IGBT.

The structure of the IGBT formed in the main IGBT cell MTC will next be described using FIGS. 6 and 7. In FIGS. 6 and 7, a part of the main IGBT cell MTC shown in FIG. 3, which extends from the dummy region to the central portion of the active region is shown in an enlarged form. Unlike FIG. 5, the illustration of the interlayer insulating film IL over the semiconductor substrate SB and a wiring M1 above each contact plug CP is not omitted in FIG. 7.

A configuration in the semiconductor substrate SB shown in FIGS. 6 and 7 is similar to that of the sense IGBT cell STC (refer to FIGS. 4 and 5) except that the $n^+$-type semiconductor regions S2 (refer to FIGS. 4 and 5) are not formed.

That is, only each well FW is formed in the main surface of the semiconductor substrate SB between the trench gate electrode G1 and the trench gate electrode G2 adjacent to each other. Thus, as shown in FIG. 6, only each well FW is formed in the upper surface of the semiconductor substrate SB adjacent to the emitter electrode S1 through the trench gate electrode G1. In other words, in the main IGBT cell MTC, no n-type semiconductor region held in a floating state is formed over the upper surface of the well FW.

Further, as shown in FIG. 7, the interlayer insulating film IL included principally of a silicon oxide film is formed over the semiconductor substrate SB. The interlayer insulating film IL is in contact with the upper surfaces of the emitter electrodes S1, the trench gate electrodes G1 and G2, the channel regions CH, and the wells FW. That is, in the main IGBT cell MTC, the wells FW are formed in the upper surface of the semiconductor substrate SB over the entire region between the trench gate electrodes G1 and G2 adjacent to each other in the X direction, and the upper surfaces of the wells FW are in contact with the bottom face of the interlayer insulating film IL. The wiring M1 included principally of, for example, Al (aluminum) is formed over the interlayer insulating film IL. Each contract plug CP being integral with the wiring M1 is formed so as to be penetrated through the interlayer insulating film IL from the bottom face of the wiring M1 to the main surface of the semiconductor substrate SB.

<Operation of Semiconductor Device According to the Present Embodiment>

Figure 8:
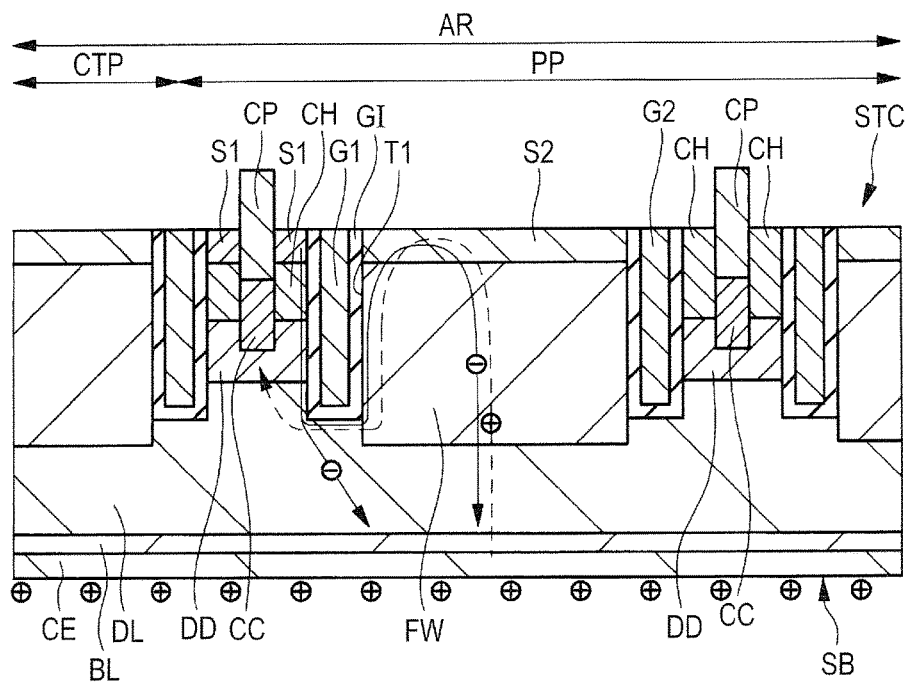
FIG. 8 is a sectional diagram describing the operation of a sense IGBT which configures the semiconductor device according to the embodiment 1 of the present invention.
Figure 30:
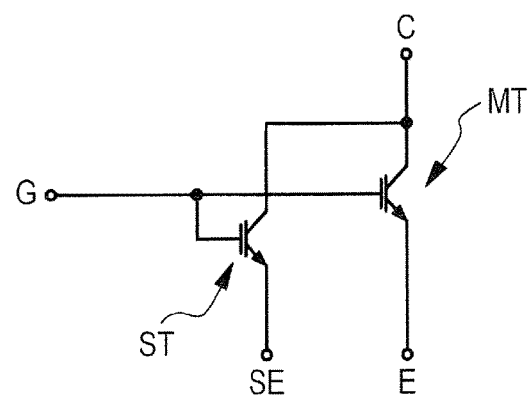
FIG. 30 is an equivalent circuit diagram showing the semiconductor device according to the embodiment 1 of the present invention.

The operation of the sense IGBT which configures the semiconductor device according to the present embodiment will be described below using FIGS. 8 and 30. FIG. 8 shows a cross section of the peripheral portion PP in the active region AR shown in FIG. 5 and is a sectional diagram for describing the operation of the sense IGBT. FIG. 30 is an equivalent circuit diagram showing a coupling relationship between the main IGBT and sense IGBT in the semiconductor device according to the present embodiment. In FIG. 8, an electron flowing path is indicated by a solid line, and a positive-hole flowing path is indicated by a broken line.

As shown in FIG. 30, respective gate electrodes of a sense IGBTST and a main IGBTMT, i.e., the trench gate electrodes G1 shown in FIGS. 2 and 3 are electrically coupled to each other and applied with the same gate voltage. Also, respective collector electrodes of the sense IGBTST and the main IGBTMT are electrically coupled to each other and applied with the same collector voltage. Further, voltages different from each other are respectively applied to an emitter electrode of the sense IGBTST and an emitter electrode of the main IGBTMT.

That is, the sense IGBTST is an IGBT of small area whose collector and gate are common to the main IGBTMT and coupled in parallel. It is possible to detect a collector current flowing through the main IGBTMT from a current mirror ratio between the sense IGBTST and the main IGBTMT and a collector current of the sense IGBTST.

When the sense IGBTST and the main IGBTMT are operated, a predetermined voltage (e.g., 15V) is applied to the gate electrode of each transistor, and a predetermined voltage is applied to each of the emitter electrode and collector electrode of each transistor.

That is, when the GGEE type IGBT is operated, a common gate voltage is applied to the trench gate electrodes G1 (refer to FIG. 7) of the main IGBT cell MTC and the trench gate electrodes G1 (refer to FIG. 5) of the sense IGBT cell STC. Also, a first emitter voltage is applied to the emitter electrodes S1 and trench gate electrode G2 (refer to FIG. 7) of the main IGBT cell MTC. A second emitter electrode is applied to the emitter electrodes S1 and trench gate electrode G2 (refer to FIG. 5) of the sense IGBT cell STC. Further, a common collector voltage is applied to the collector electrodes CE (refer to FIGS. 7 and 5) of the main IGBT cell MTC and the sense IGBT cell STC.

At this time, in the sense IGBT shown in FIG. 8, conductivity modulation occurs due to the positive holes accumulated in the drift region including the drift layer DL and the well FW. Thus, the resistance value of each channel region CH is lowered, whereby a current flows between the emitter and collector. That is, electrons having flowed from the contact plug CP to the emitter electrode S1 pass within the channel region CH and within the n-type semiconductor region DD along the side wall of the trench T1 embedded with the trench gate electrode G1 and linearly pass within the drift layer DL to be discharged into the collector electrode CE.

Thus, in addition to the electrons linearly moved from the bottom face of the trench gate electrode G1 to the collector electrode CE, in the present embodiment, there exist electrons which are moved within the semiconductor substrate SB along the side wall and bottom face of the trench T1 from the emitter electrode S1 and which are thereafter moved within the well FW along the opposite side wall of the trench T1 and pass through the $n^+$-type semiconductor region S2, the well FW and the drift layer DL to move into the collector electrode CE. Thus, the reason why some electrons flow into the collector electrode CE after passing within the well FW is because the $n^+$-type semiconductor region S2 is formed in the upper surface of the well FW.

Positive holes supplied from the collector electrode CE by the flow of the electrons into the well FW are attracted to the electrons flowing within the well FW. Thus, after the positive holes pass through the drift layer DL, the well FW, and the $n^+$-type semiconductor region S2 in order, they are moved to the contact plug CP contacting the emitter electrode S1 through the well FW, the n-type semiconductor region DD, and the $p^+$-type semiconductor region CC in the vicinity of the trench gate electrode G1. Due to this process, some of the positive holes supplied from the collector electrode CE are accumulated in the well FW. As a result, the number of the positive holes existing in the well FW is increased so that conductivity modulation is accelerated. That is, since the sense IGBT of the present embodiment is smoothly accelerated in conductivity modulation as compared with the IGBT formed with no $n^+$-type semiconductor region S2 over the upper surface of the well FW held in the floating state, the on voltage of the IGBT can be lowered.

Incidentally, since no $n^+$-type semiconductor region S2 is formed over the upper surface of each well FW in the main IGBT cell MTC shown in FIG. 7, there is little flow of electrons into the well FW upon the operation of the main IGBT as compared with the sense IGBT.

<Main Features and Effects of the Present Embodiment>

Figure 31:
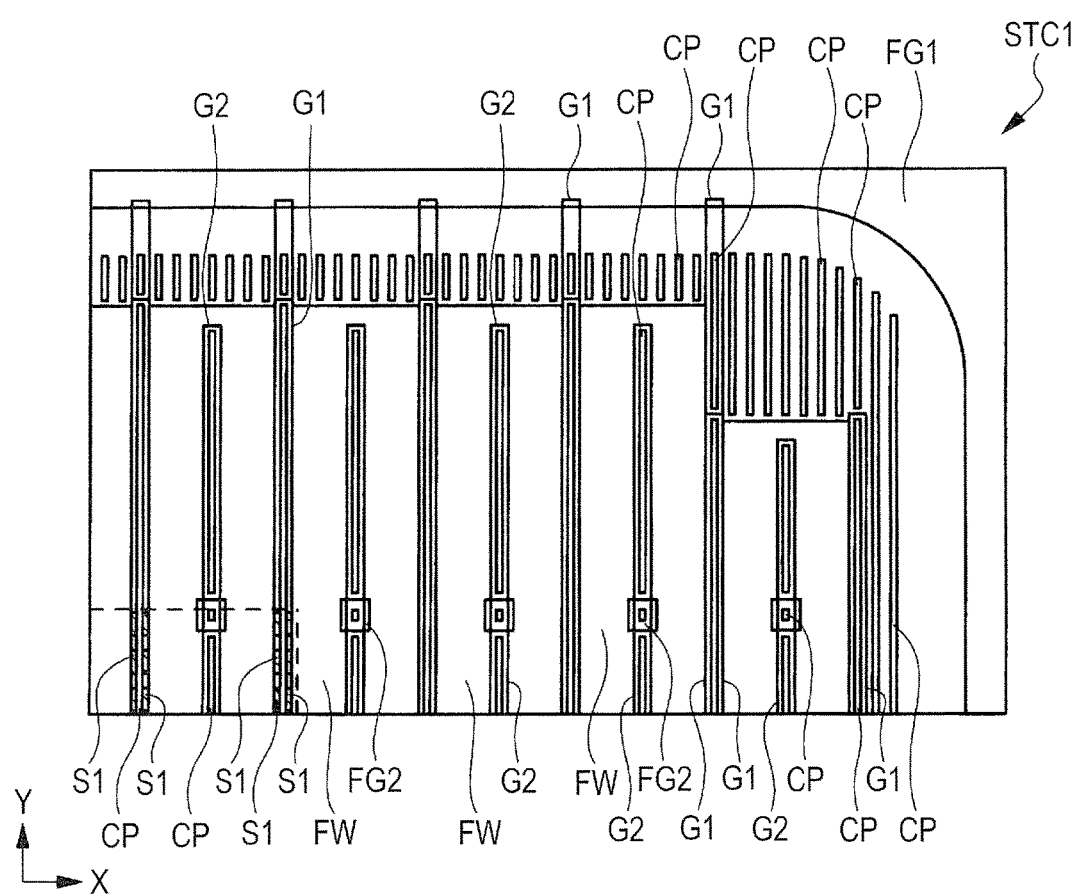
FIG. 31 is a plan diagram showing a sense IGBT cell which configures a semiconductor device according to a comparative example.
Figure 32:
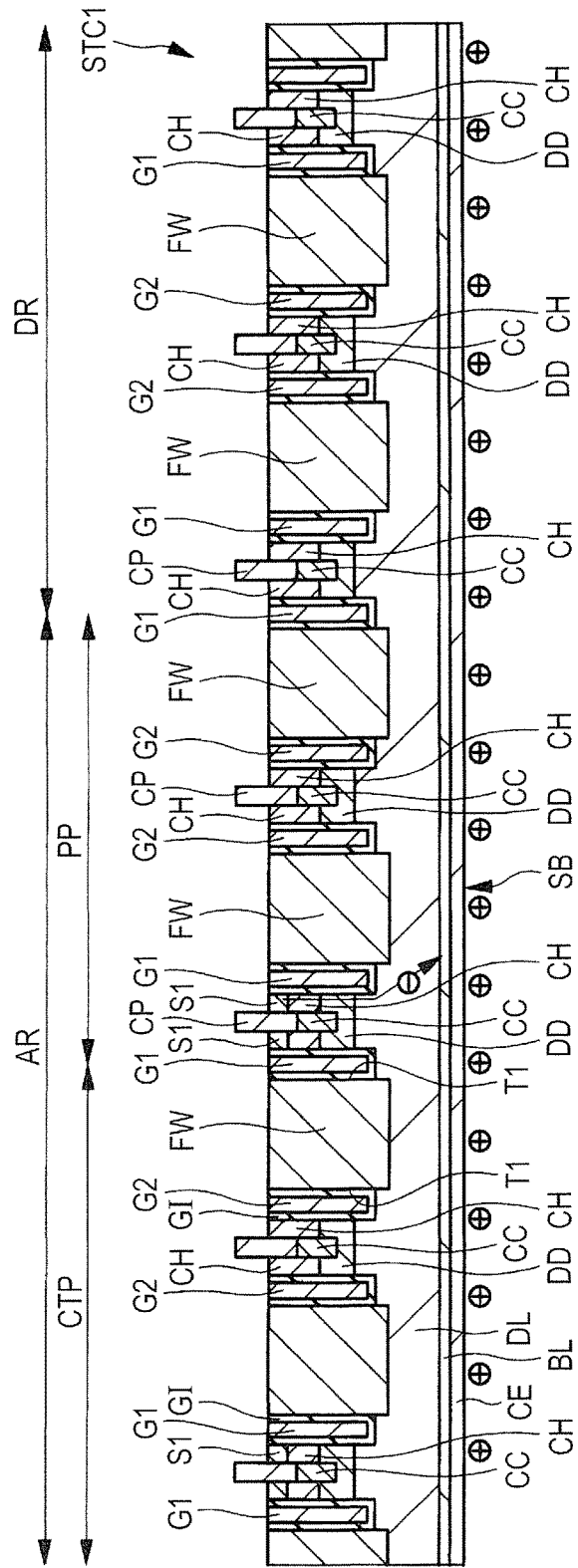
FIG. 32 is a sectional diagram showing the sense IGBT cell which configures the semiconductor device according to the comparative example.
Figure 33:
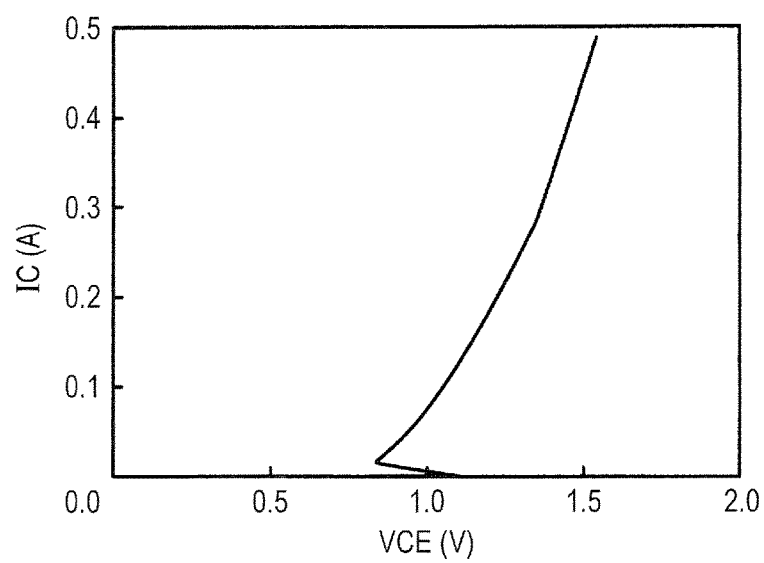
FIG. 33 is a graph showing an output characteristic of a sense IGBT which configures the semiconductor device according to the comparative example.
Figure 34:
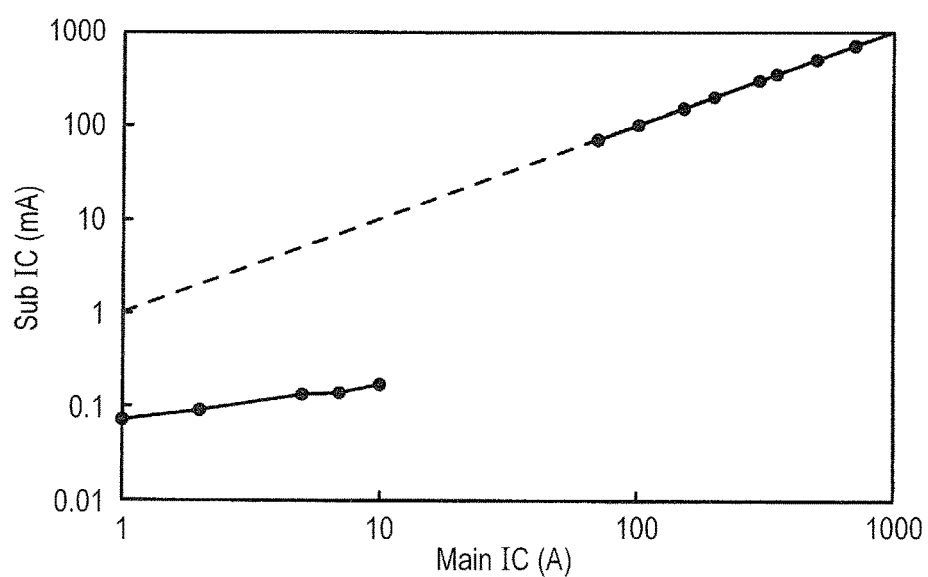
FIG. 34 is a graph showing sense ratio characteristics of a main IGBT and sense IGBT which configure the semiconductor device according to the comparative example.

Main features and effects of the semiconductor device according to the present embodiment will hereinafter be described using FIGS. 31 through 34. FIG. 31 is a plan diagram showing a semiconductor device according to a comparative example. FIG. 32 is a sectional diagram showing the semiconductor device according to the comparative example. FIG. 33 is a graph showing a relationship between the voltage and current of a sense IGBT which configures the semiconductor device according to the comparative example, i.e., a graph showing an output characteristic of the sense IGBT. FIG. 34 is a graph showing a relationship between respective currents of main and sense IGBTs in the semiconductor device according to the comparative example, i.e., a graph showing sense ratio characteristics.

A plan diagram of a sense IGBT cell STC1 showing the semiconductor device according to the comparative example is shown in FIG. 31. A sectional diagram of the IGBT cell STC1 is shown in FIG. 32. The semiconductor device according to the comparative example is one having a main IGBT similar to the present embodiment and further having the sense IGBT cell STC1. As shown in FIGS. 31 and 32, the sense IGBT cell STC1 of the comparative example has a structure similar to that of the sense IGBT cell of the present embodiment except that no $n^+$-type semiconductor region S2 (refer to FIGS. 2, 4 and 5) is fainted over the upper surface of each well FW. Incidentally, although only the part of the end of the dummy region DR is shown in FIG. 5, a wider range of a dummy region DR of the sense IGBT cell STC1 in an X direction is shown in FIG. 32 as compared with FIG. 5.

As shown in FIG. 32, when the sense IGBT of the comparative example is operated, electrons flow from a contact plug CP to an emitter electrode S1 and thereafter pass within a channel region CH and an n-type semiconductor region DD along the side wall of a trench T1 embedded with a trench gate G1, and linearly pass within a drift region DL to be discharged into a collector electrode CE. In this case, as described using FIG. 8, the electrons are hardly moved to the collector electrode CE after passing within the well FW adjacent to the trench gate electrode G1.

Here, when conductivity modulation of the sense IGBT is not smoothly shifted and a difference in potential between its emitter and collector is small in a peripheral portion PP of an active region AR, there is a case where a current hardly flows between the emitter and collector even though a collector voltage VCE is increased. In this case, a graph showing a relationship between the collector voltage VCE (horizontal axis) and collector current IC (vertical axis) in the sense IGBT cell is represented in such a shape as shown in FIG. 33.

That is, since the conductivity modulation is not normally shifted in a low current region in which the collector voltage is 1.1V or less as shown in the graph of the output characteristic of the sense IGBT in FIG. 33, the collector current of the sense IGBT becomes $\frac{1}{10}$ or lees as compared with the current to originally flow through the sense IGBT.

On the other hand, the main IGBT cell (not shown) of the semiconductor device according to the comparative example does not cause a problem that the current is hard to flow in a low voltage region in this way. Thus, the sense ratio characteristics of the main IGBT and the sense IGBT are represented like graphs shown in FIG. 34. FIG. 34 shows sense ratio characteristics where a sense ratio between the sense IGBT and the main IGBT is 1:1000. The horizontal axis of FIG. 34 indicates a collector current (Main IC) of the main IGBT, and the vertical axis thereof indicates a collector current (Sub IC) of the sense IGBT.

When the sense IGBT and the main IGBT are normally operated, the collector current of the sense IGBT should be $\frac{1}{1000}$ of the collector current of the main IGBT. That is, the normal sense ratio characteristic of the semiconductor device should be like the graph indicated by a broken line in FIG. 34.

Since, however, the collector current of the sense IGBT in the comparative example becomes $\frac{1}{10}$ or less as compared with the current to flow through the sense IGBT in the low current region, the sense ratio characteristic graph is shifted from the graph indicated by the broken line. That is, a sense ratio abnormality occurs.

In such a case, when the collector current of the sense IGBT is measured, the collector current of the main IGBT cannot be calculated from the corresponding collector current according to the sense ratio in the low current region. Therefore, a problem arises in that it is not possible to use the sense IGBT as a current detecting element for sensing in the low current region. In other words, since there occurs a problem that a current region which enables the current value of the main IGBT to be detected becomes small due to the sense IGBT, the performance of the semiconductor device is degraded.

The main reason why there no occurs the problem that the current is hard to flow in the low current region in the main IGBT, while in the sense IGBT as described above, the current becomes hard to flow in the low current region is because the dummy region at the peripheral portion of the sense IGBT cell has a width larger than that of the dummy region at the peripheral portion of the main IGBT cell. That is, the arrangement of a plurality of dummy cells side by side in the periphery of the active region in the sense IGBT cell STC1 (refer to FIG. 31) means that a positive hole accumulation layer to which an electron current to be a trigger for conductivity modulation is not delivered, exists on the main surface side of the semiconductor substrate in a large area.

In this case, the gate voltage is gradually applied to the trench gate electrode G1 to invert the channel region of the sense IGBT. Thus, the electron current starts to flow and is attracted to the electrons having reached the back surface of the semiconductor substrate SB shown in FIG. 32, and hence the positive holes are injected into the semiconductor substrate SB through a pn junction included of the buffer layer BL and the collector electrode CE on the back surface side. The outermost periphery (peripheral portion PP) of the active region AR of the cell is affected by the large-area dummy region DR adjacent thereto, so that the balance between the electrons and the positive hole accumulation layer greatly collapses as compared with the inside (central portion CTP) of the cell, and a positive feedback shifted to the conductivity modulation is not generated smoothly, thereby generating a sense ratio abnormality in the low current region.

That is, since the conductivity modulation is normally not shifted at the peripheral portion PP in the active region AR due to that the positive holes are hard to be accumulated in the well FW, the sense ratio abnormality occurs. On the other hand, in the main IGBT cell, the width of the dummy region at the outer periphery of the cell is small. Thus, even in the low current region, the conductivity modulation is smoothly shifted at the peripheral portion of the active region so that the current normally flows.

Thus, as the main feature of the present embodiment, the $n^+$-type semiconductor region S2 is provided at the part of the upper surface of each well FW of the sense IGBT cell STC as shown in FIGS. 2, 4 and 5. When the sense IGBT is operated here, some electrons pass through the emitter electrode S1, the channel region CH, and the n-type semiconductor region DD and thereafter pass through the path through which the electrons are linearly moved to the collector electrode CE side, as described using FIG. 8. Further, as described using FIG. 8, other electrons are bypassed within the semiconductor substrate SB near the bottom of the trench T1 adjacent to the emitter electrode S1 and flow into the collector electrode CE after passing within the well FW and the $n^+$-type semiconductor region S2. That is, the $n^+$-type semiconductor region S2 is formed to thereby make it possible to change the path such that some electrons are moved within the well FW.

Thus, the electron current is attracted to the electrons passing within the well FW, and hence the positive holes are injected into the semiconductor substrate SB through the pn junction included of the buffer layer BL and the collector electrode CE, after which they are moved along the path of the electrons and accumulated in the well FW kept in the floating state. Thus, since the effect of accumulating the positive holes in the well FW is enhanced, conductivity modulation in the sense IGBT is accelerated (promoted). Particularly, the conductivity modulation is accelerated in the outermost peripheral cell of the active region AR in the sense IGBT cell STC, i.e., the IGBT cell at the peripheral portion PP, so that there can be obtained an effect that a bent waveform of such a graph as shown in FIG. 33 is improved. As a result, since the current normally flows even in the low current region in the sense IGBT cell STC, the sense ratio characteristic becomes a characteristic along the graph indicated by the broken line in FIG. 34.

Thus, since the relation of magnitude between the current values of the sense IGBT and the main IGBT becomes a relation according to the sense ratio, it is possible to calculate the collector current of the main IGBT from the collector current of the sense IGBT even in the low current region. Accordingly, since it is possible to enlarge the current region which enables the current value of the main IGBT to be detected by the sense IGBT, the performance of the semiconductor device can be enhanced.

Also, in the present embodiment, no $n^+$-type semiconductor region S2 is provided over the upper surface of each well FW in the main IGBT cell MTC shown in FIGS. 3, 6, and 7. This is because when the $n^+$-type semiconductor region S2 is provided in the main IGBT cell MTC, the positive holes are excessively accumulated in the well FW, and a long time is required to discharge the positive holes from within the well FW when the IGBT is turned off. That is, in order to prevent a switching speed from being lowered and prevent a switching loss from occurring, no $n^+$-type semiconductor regions S2 are formed in the main IGBT cell MTC here.

Further, in the present embodiment, the adoption of the GGEE type enables prevention of an increase in the switching loss, a reduction in the switching speed, and destruction of the IGBT. That is, since the emitter voltage other than the gate voltage is applied to each trench gate electrode G2 shown in FIG. 5 and no emitter electrode S1 is provided between the trench gate electrodes G2 adjacent to each other, the positive holes accumulated in the well FW can efficiently be discharged from the contact plug CP between the adjacent trench gate electrodes G2 at the turning off of the IGBT. Further, when the gate voltage is applied to both of the trench gate electrodes G1 and G2, a gate-collector capacitance becomes excessively large. Since, however, the emitter voltage is applied to the trench gate electrode G2 in the present embodiment, it is possible to prevent such an increase in capacitance.

Therefore, in the GGEE type IGBT of the present embodiment, the off operation of the IGBT can be performed at high speed as compared with the GG (Gate-Gate) type IGBT in which the gate voltage is applied to all the trench gate electrodes G1 and G2. Thus, it is possible to prevent an increase in the switching loss and a reduction in the switching speed. Further, it is possible to prevent destruction due to the excessive accumulation of the positive holes in the well FW from occurring.

Further, even in the case where the dummy region of the sense IGBT cell is the same in width as the dummy region of the main IGBT cell although the present embodiment has described the case where the dummy region of the sense IGBT cell has the width larger than that of the dummy region of the main IGBT cell, a failure in operation in the low voltage region of the sense IGBT can be prevented by forming the $n^+$-type semiconductor region S2 over the upper surface of each well FW shown in FIG. 5. This is because even when only one cell at the outermost periphery of each of the sense IGBT cell and the main IGBT cell is formed as the dummy region DR, there is a case where the conductivity modulation in the low current region is hard to be shifted in the sense IGBT cell as compared with the main IGBT cell, and the normal current does not flow.

Incidentally, although the $n^+$-type semiconductor region S2 is formed even above the well FW in the dummy region DR here, the $n^+$-type semiconductor region S2 in the dummy region DR may not be formed.

<Modification 1>

Figure 9:
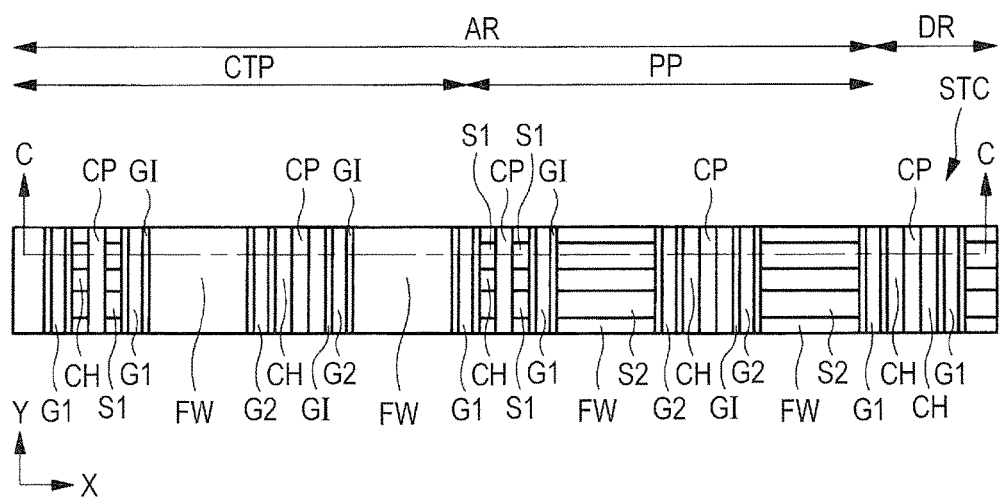
FIG. 9 is a plan diagram showing a sense IGBT cell which configures a semiconductor device according to a modification 1 of the embodiment 1 of the present invention.
Figure 10:
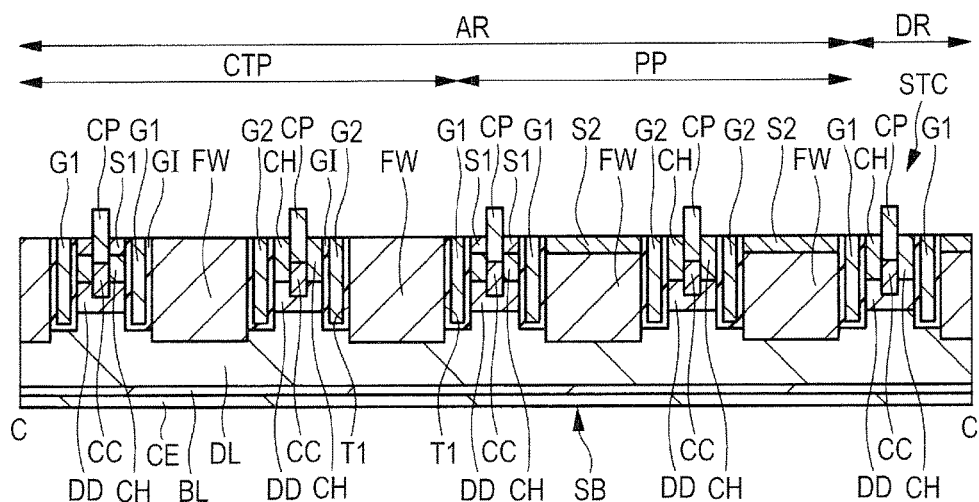
FIG. 10 is a sectional diagram taken along line C-C of FIG. 9.

A modification 1 of the semiconductor device according to the present embodiment will be described using FIGS. 9 and 10. FIG. 9 is a plan diagram of the semiconductor device according to the modification 1 of the present embodiment. FIG. 10 is a sectional diagram of the semiconductor device according to the modification 1 of the present embodiment. FIG. 10 is a sectional diagram taken along line C-C of FIG. 9. FIGS. 9 and 10 respectively show the structure of a sense IGBT cell at a place corresponding to each of FIGS. 4 and 5.

The present modification will describe a semiconductor device having a sense IGBT cell STC formed with no $n^+$-type semiconductor region S2 over the upper surface of each well FW at a central portion CTP of an active region AR as shown in FIGS. 9 and 10. That is, no $n^+$-type semiconductor region S2 is formed in the central portion CTP which is most of the upper surface of a semiconductor substrate SB in the sense IGBT cell STC, and an $n^+$-type semiconductor region S2 is formed only over the upper surface of each of wells FW in a peripheral portion PP of the active region AR and a dummy region DR. Other structures are similar to those in the semiconductor device described using FIGS. 1 through 7.

The whole upper surface of each well FW between a trench gate electrode G1 and a trench gate electrode G2 adjacent to each other is exposed to the upper surface of the semiconductor substrate SB inwardly (central portion CTP) from the cell at the outermost periphery (peripheral portion PP) in the active region AR of the sense IGBT cell STC in plan view and is in contact with the lower surface of an interlayer insulating film IL (refer to FIG. 7) over the semiconductor substrate SB.

In the comparative example shown in FIGS. 31 and 32, the peripheral portion PP is affected by the large-area dummy region DR adjacent thereto, so that the balance between the electrons and the positive hole accumulation layer greatly collapses as compared with the inside (central portion CTP) of the cell to generate the sense ratio abnormality in the low current region. In the cell at the central portion CTP of the sense IGBT cell STC1, however, there occurs no problem that the current is hard to flow in the low current region. That is, as in the present modification shown in FIGS. 9 and 10, the sense ratio abnormality is solved by providing the $n^+$-type semiconductor region S2 over the upper surface of each well FW at the peripheral portion PP even without providing the $n^+$-type semiconductor region S2 at the central portion CTP, and hence an effect similar to that of the semiconductor device described in FIGS. 1 through 7 can be obtained.

Further, a problem arises in that when the $n^+$-type semiconductor region S2 is provided at the central portion CTP of the sense IGBT cell STC, a long time is required to discharge the positive holes from within each well FW when turning off the IGBT where the positive holes are excessively accumulated in the well FW at the central portion CTP, thereby causing a reduction in switching speed and an increase in loss. On the other hand, since no $n^+$-type semiconductor region S2 is provided at the central portion CTP in the preset modification, it is possible to reduce a switching loss at the time of operation of the sense IGBT and improve a switching speed.

Incidentally, in the main IGBT cell, no $n^+$-type semiconductor region S2 is formed even in both the central and peripheral portions of the active region and the dummy region.

<Modification 2>

Figure 11:
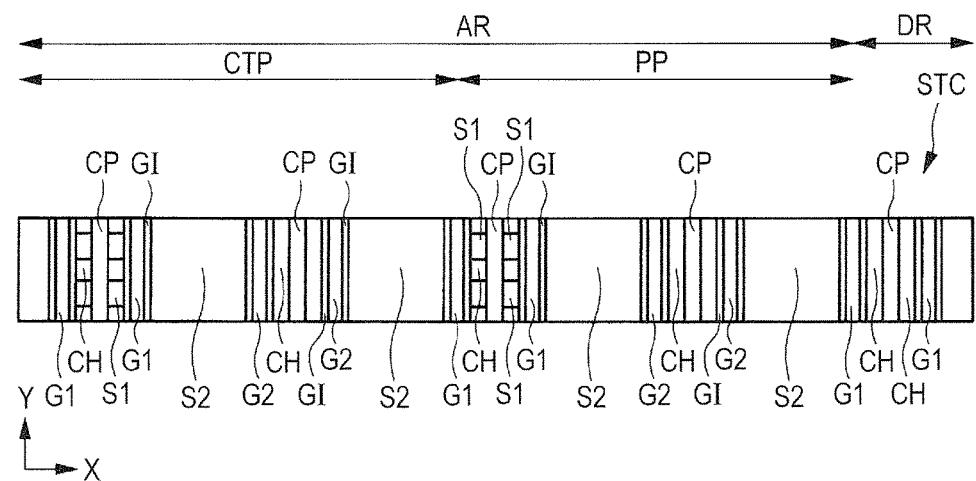
FIG. 11 is a plan diagram showing a sense IGBT cell which configures a semiconductor device according to a modification 2 of the embodiment 1 of the present invention.

A modification 2 of the semiconductor device according to the present embodiment will be described using FIG. 11. FIG. 11 is a plan diagram of the semiconductor device according to the modification 2 of the present embodiment. A structure of a sense IGBT cell at a place corresponding to FIG. 4 is shown in FIG. 11.

As shown in FIG. 11, the semiconductor device according to the present embodiment is different from the semiconductor device described using FIGS. 1 through 7 and may be provided with an $n^+$-type semiconductor region S2 over the entire upper surface of each well FW of the sense IGBT cell STC.

In other words, in the sense IGBT cell STC, the $n^+$-type semiconductor region S2 is formed over the entire upper surface of a semiconductor substrate SB in a region between a trench gate electrode G1 and a trench gate electrode G2 adjacent to each other. In the whole of the corresponding region, the upper surface of the $n^+$-type semiconductor region S2 is in contact with the lower surface of an interlayer insulating film IL (refer to FIG. 7) lying over the semiconductor substrate SB.

That is, in the case where each emitter electrode S1 and each $n^+$-type semiconductor region S2 are adjacent to each other in an X direction, the Y-direction width of the $n^+$-type semiconductor region S2 is larger than the Y-direction width of the emitter electrode S1.

Thus, it is possible to appropriately change a region for forming the $n^+$-type semiconductor region S2.

<Modification 3>

Figure 12:
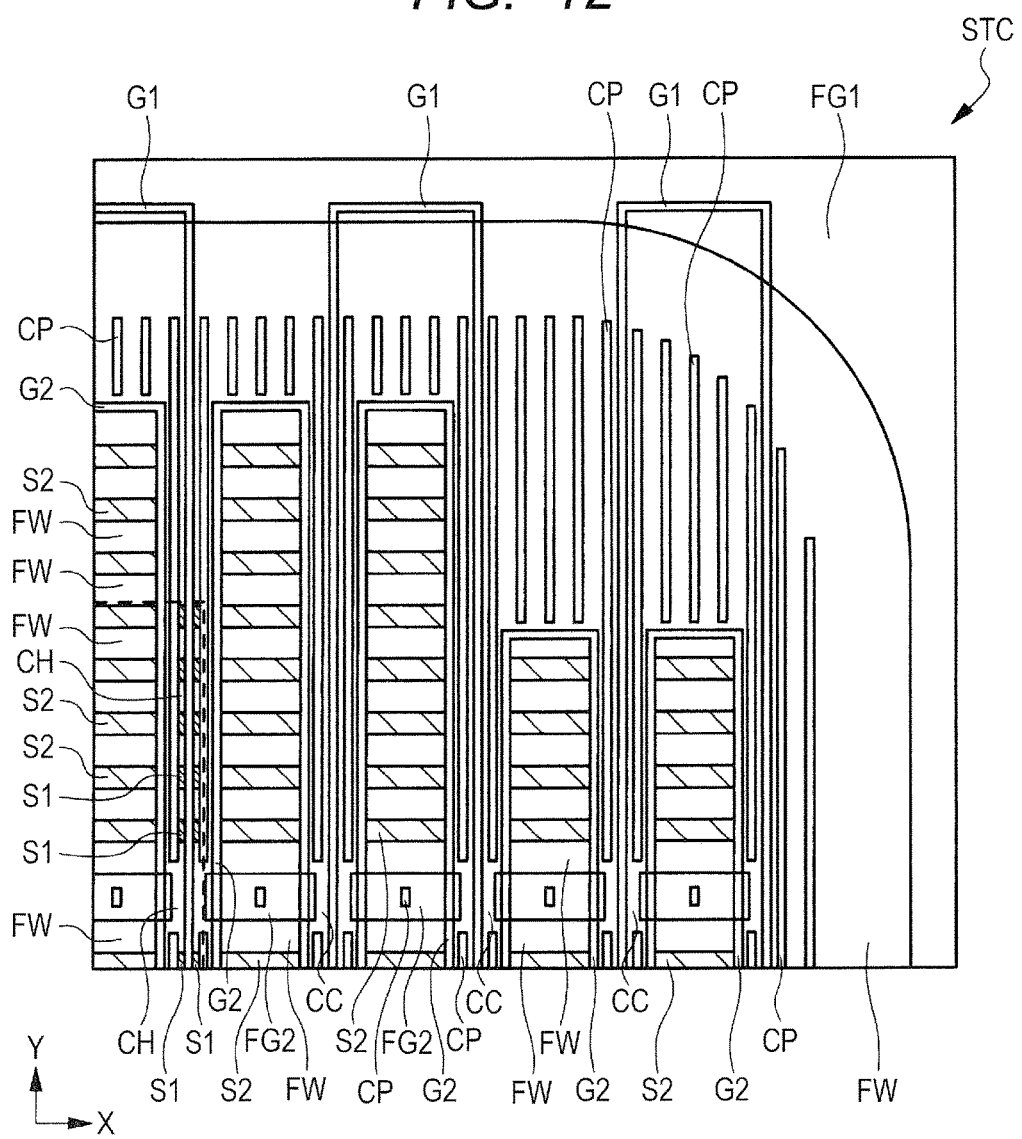
FIG. 12 is a plan diagram showing a sense IGBT cell which configures a semiconductor device according to a modification 3 of the embodiment 1 of the present invention.
Figure 13:
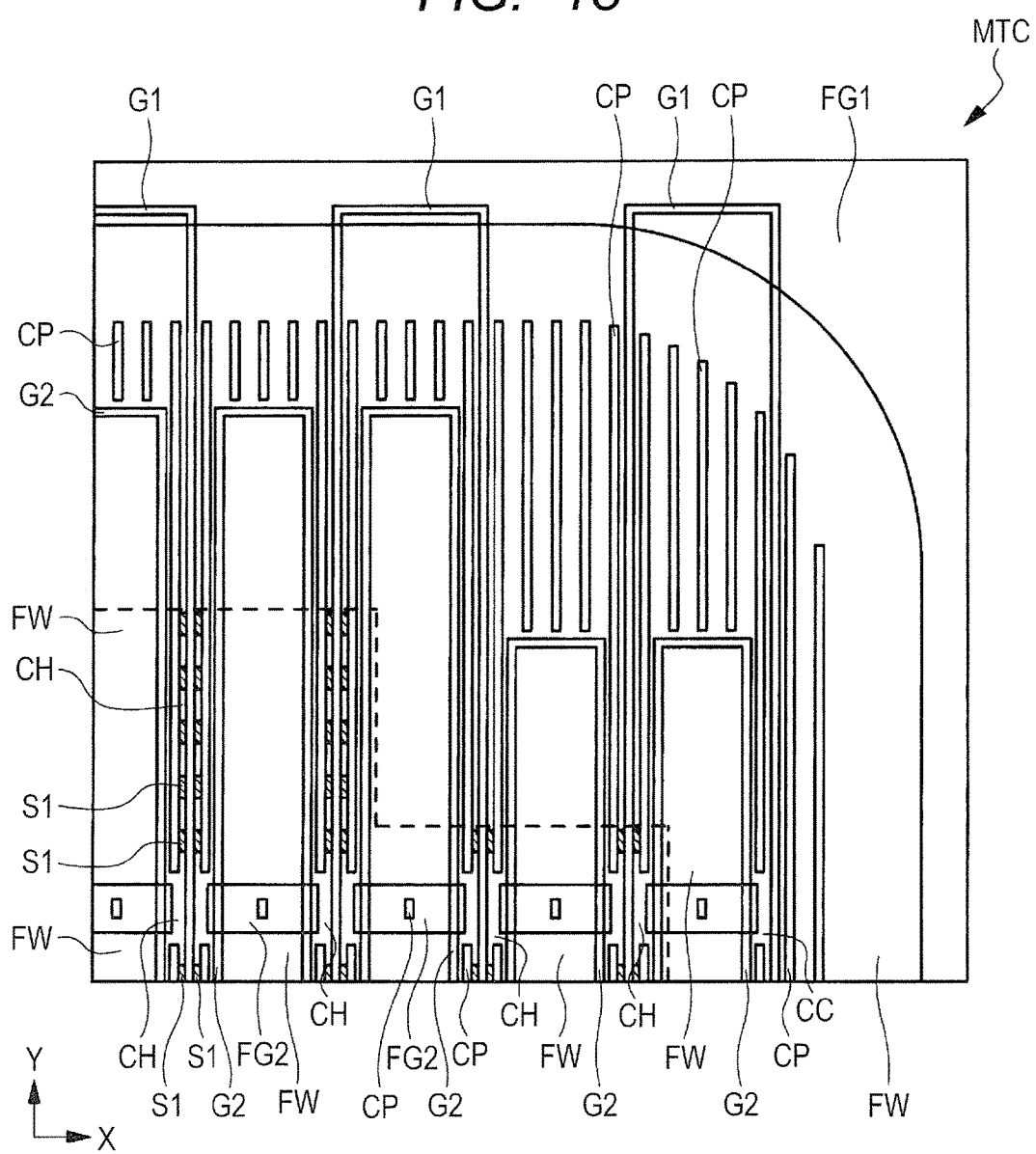
FIG. 13 is a plan diagram showing a main IGBT cell which configures the semiconductor device according to the modification 3 of the embodiment 1 of the present invention.
Figure 14:
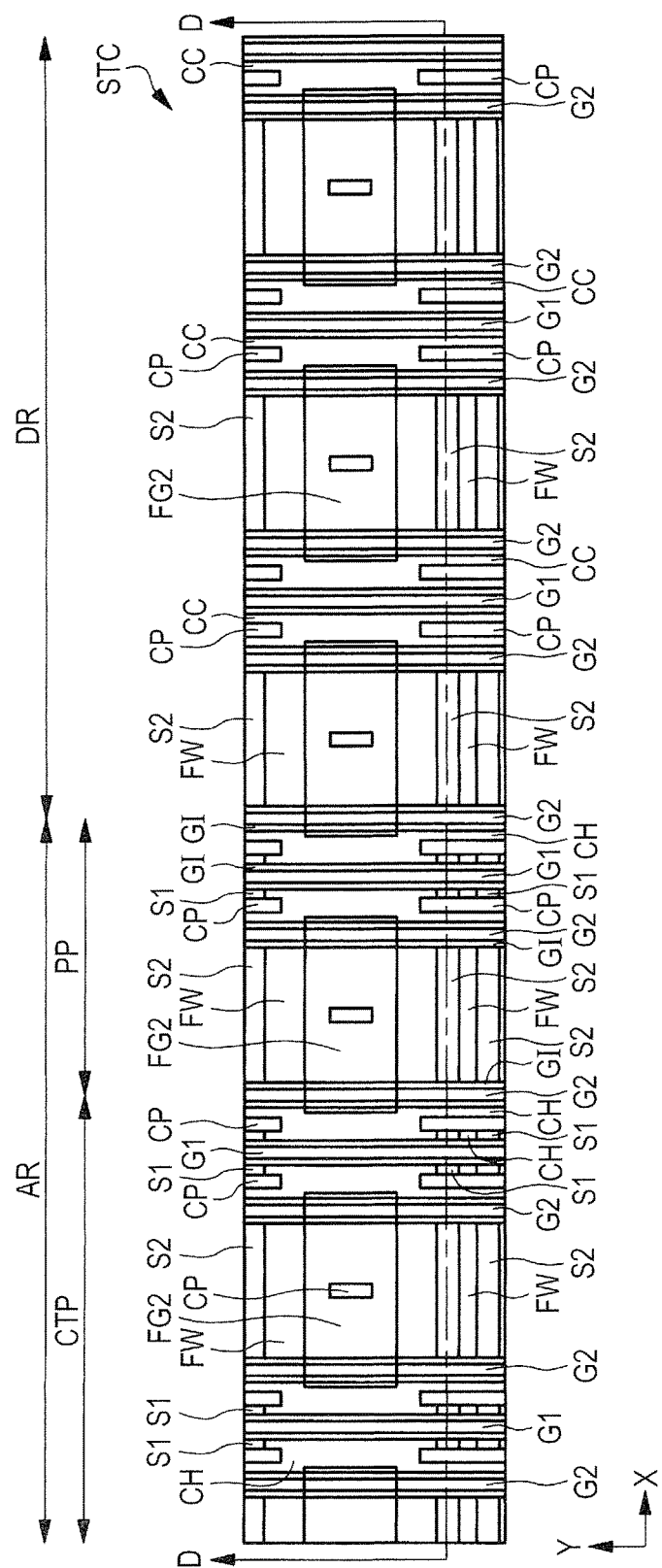
FIG. 14 is a plan diagram showing the sense IGBT cell which configures the semiconductor device according to the modification 3 of the embodiment 1 of the present invention.
Figure 15:
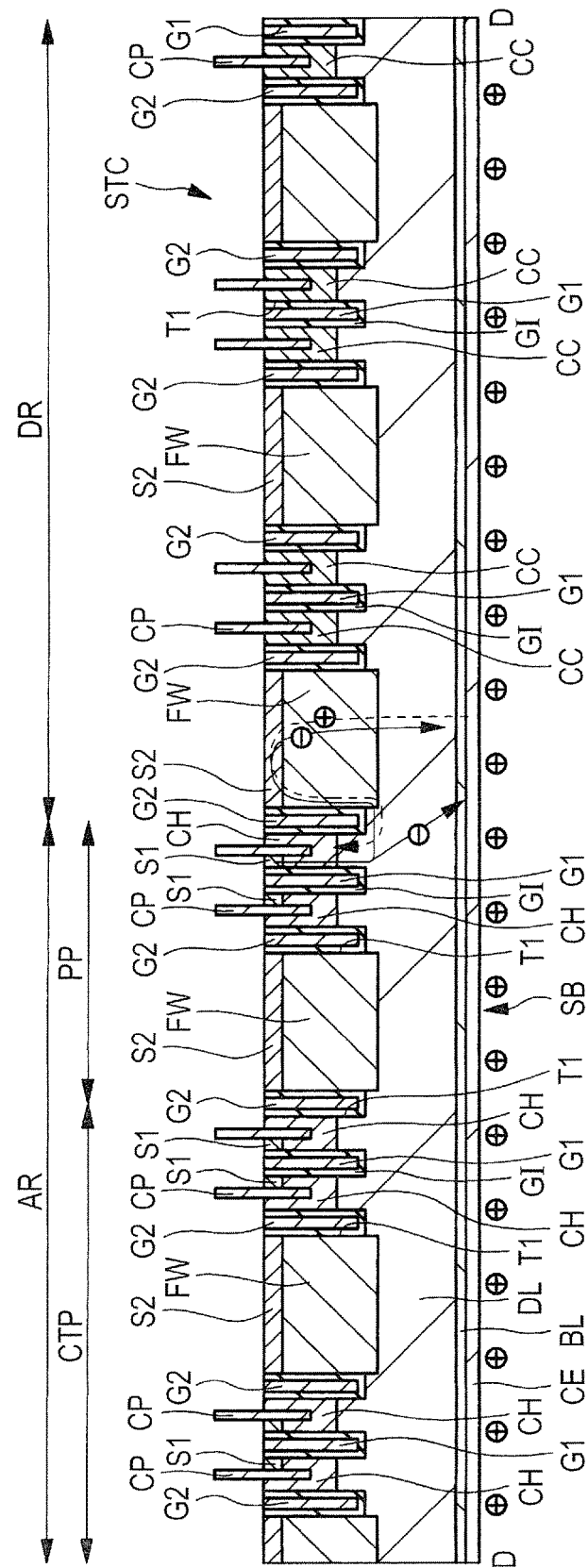
FIG. 15 is a sectional diagram taken along line D-D of FIG. 14.

A modification 3 of the semiconductor device according to the present embodiment will be described using FIGS. 12 through 17. FIGS. 12 through 14 and FIG. 16 are respectively plan diagrams of the semiconductor device according to the modification 3 of the present embodiment. FIGS. 15 and 17 are sectional diagrams of the semiconductor device according to the modification 3 of the present embodiment. A part of FIG. 12 is shown in FIG. 14 in an enlarged form, and a part of FIG. 13 is shown in FIG. 17 in an enlarged form. FIG. 15 is a sectional diagram taken along line D-D of FIG. 14, and FIG. 17 is a sectional diagram taken along line E-E of FIG. 16. A plan layout corresponding to the enlarged plan diagram on the lower side of FIG. 2 is shown in FIG. 12. Further, a plan layout corresponding to FIG. 3 is shown in FIG. 13. The contour of an active region (energizing region) is indicated by a broken line in FIGS. 12 and 13.

Although the IGBT on the GGEE side has been described in FIGS. 1 through 11, the feature of the present embodiment can be applied even to an EGE type (Emitter-Gate-Emitter type) IGBT to be described below.

A plan diagram of the corner of an EGE type IGBT cell STC is shown in FIG. 12. As shown in FIG. 12, a plurality of trenches are formed in the main surface of a semiconductor substrate side by side in a stripe form. Trench gate electrodes G1 applied with a gate voltage are formed in some trenches. Trench gate electrodes G2 applied with an emitter voltage are formed in some other trenches. The trench gate electrodes G1 and G2 respectively extend in a Y direction and are arranged side by side in plural form in an X direction.

Here, the two trench gate electrodes G2 and one trench gate electrode G1 are alternately arranged at the main surface of the semiconductor substrate in the X direction. That is, the trench gate electrodes G2 are respectively formed inside the two trenches interposing the trench gate electrode G1 therebetween in the X direction. Further, of both adjacent trenches to the trench gate electrode G2 in the X direction, the trench gate electrode G1 is formed within one thereof, and the trench gate electrode G2 is formed within the other thereof.

In other words, a unit cell of one IGBT including the two trench gate electrodes G2 applied with the emitter voltage and the trench gate electrode G1 arranged therebetween and applied with the gate voltage is arranged side by side in plural form in the X direction. Therefore, such an IGBT is called an EGE type. Wells FW and $n^+$-type semiconductor regions S2 are formed in the main surface of the semiconductor substrate between the unit cells side by side alternately in the Y direction. That is, the trench gate electrode G2 is arranged between the trench gate electrode G1 and the well FW. The well FW is arranged between the two trench gate electrodes G2 adjacent to each other in the X direction.

The end of the trench gate electrode G1 extends to the end of the sense IGBT cell STC in the Y direction and is coupled to a gate-voltage supplying silicon layer FG1 at the end thereof. Also, the trench gate electrodes G2 in the active region and a dummy region DR are coupled to an emitter-voltage applying silicon layer FG2 lying over the semiconductor substrate. Further, contact plugs CP extending in the Y direction without being coupled to the trench gate electrodes G1 and G2 are formed between the trench gate electrode G2 and the silicon layer FG1 in plan view in plural form side by side in the X direction.

Further, the contact plugs CP extending in the Y direction are coupled to the upper surface of the semiconductor substrate between the mutually adjacent trench gate electrodes G1 and G2 at the position where they are not arranged side by side with the silicon layer FG2 in the X direction. Thus, each contact plug CP formed at the position where it is adjacent to the trench gate electrode G1 is in contact with the side wall of each emitter electrode S1 and is used to apply the emitter voltage to the emitter electrode S1. The emitter electrodes S1 are formed only in the active region and formed side by side in plural form in the Y direction at the upper surface of the semiconductor substrate between the trench gate electrode G1 and the contact plug CP adjacent to the trench gate electrode G1.

At a place in the active region where no emitter electrode S1 is formed, a channel region CH is formed in the main surface of the semiconductor substrate between the trench gate electrode G1 and the trench gate electrode G2 adjacent to each other. That is, the channel region CH and the emitter electrode S1 are alternately arranged side by side in the Y direction at the main surface of the semiconductor substrate adjacent to each trench gate electrode G1 in the active region. Further, in the dummy region, a $p^+$-type semiconductor region CC is fainted in the main surface of the semiconductor substrate between the trench gate electrode G1 and the trench gate electrode G2 adjacent to each other.

As with the GGEE type IGBT, no emitter electrodes S1 are formed in IGBT cells in dummy regions arranged in plural form outside the active region. Four cells are arranged in the dummy region in the X direction by way of example here.

On the other hand, as shown in FIG. 13, the structure of a main IGBT cell MTC is almost similar to the sense IGBT cell. However, the main IGBT cell MTC is larger than the sense IGBT cell in terms of the scale (number) of IGBT cells and smaller than that in terms of the width of a dummy region. That is, in the outermost peripheral dummy region of the main IGBT cell MTC, one IGBT cell is provided as a dummy cell in an X direction, and the width of the dummy region of the main IGBT cell MTC is smaller than that of the dummy region of the sense IGBT cell.

The structure of an EGE type sense IGBT will next be described using FIGS. 14 and 15. The structure of an EGE type main IGBT will be described using FIGS. 16 and 17. A central portion CTP and a peripheral portion PP in an active region AR, and a dummy region DR outside than the active region AR are shown in FIGS. 14 through 17 in a manner similar to FIGS. 4 through 7.

Figure 16:
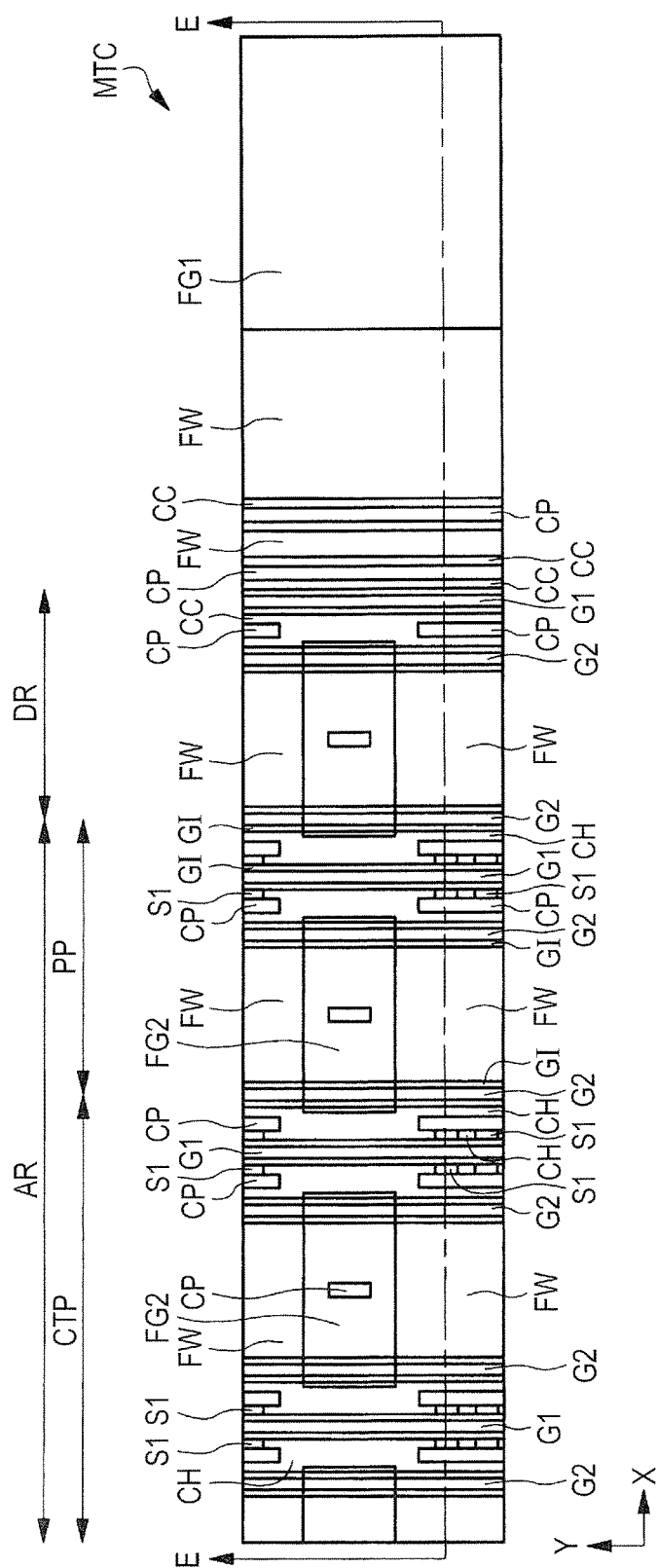
FIG. 16 is a plan diagram showing the main IGBT cell which configures the semiconductor device according to the modification 3 of the embodiment 1 of the present invention.
Figure 17:
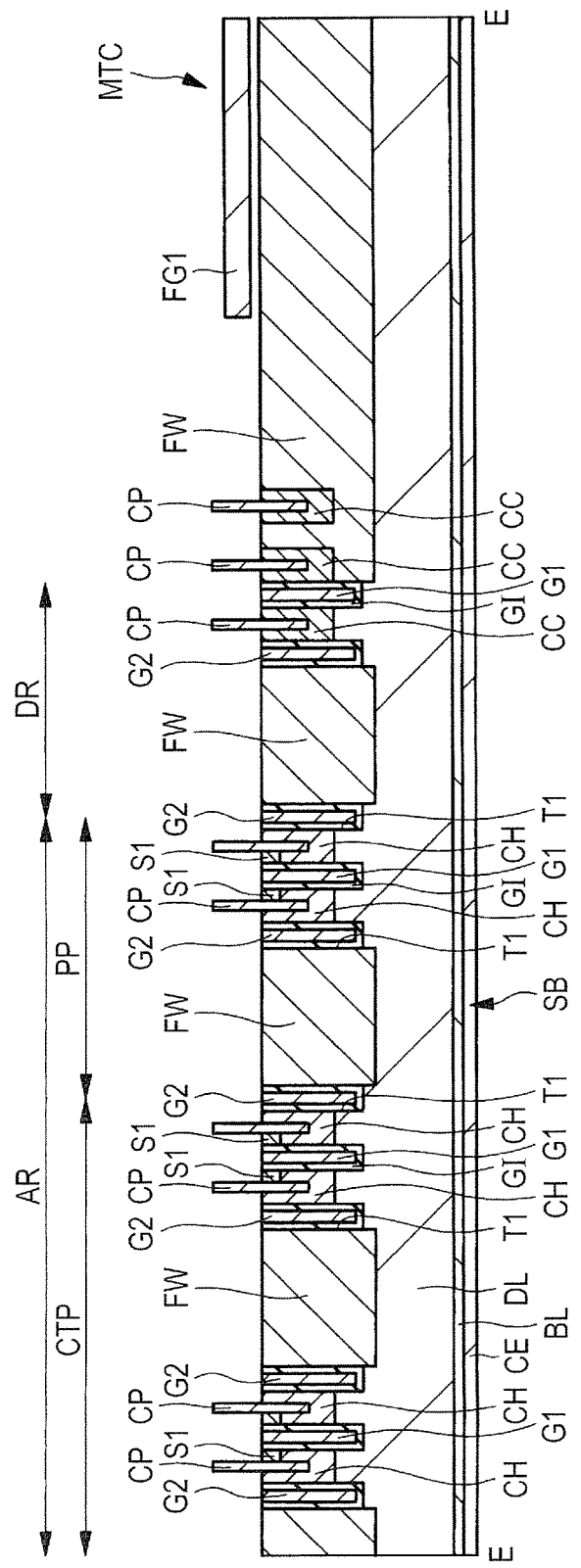
FIG. 17 is a sectional diagram taken along line E-E of FIG. 16.

A region outside than the dummy region DR is shown in FIGS. 16 and 17. A well FW is formed in a main surface of a semiconductor substrate SB outside the dummy region DR, and p$^+$-type semiconductor regions CC coupled to contact plugs CP are formed in plural form in the upper surface of the well FW. Further, a silicon layer FG1 is formed via an insulating film (not shown) at a position directly above the well FW and outside than the contact plug CP.

As shown in FIG. 15, a collector electrode CE, a buffer layer BL, and a drift layer DL are formed within the semiconductor substrate SB in order from the lower surface side. Trenches T1, trench gate electrodes G1 and G2 lying within the trenches T1, and wells FW are formed on the main surface side of the semiconductor substrate SB. These points are the same as those in the GGEE type IGBT. The well FW is formed between the trench gate electrodes G2 adjacent to each other. The p$^+$-type semiconductor region CC shallower than each trench T1 in terms of its depth to be foamed is formed in the main surface of the semiconductor substrate SB between the trench gate electrode G1 and the trench gate electrode G2 adjacent to each other in the dummy region DR. Further, a channel region CH shallower than each trench T1 in terms of its depth to be formed is formed in the main surface of the semiconductor substrate SB between the trench gate electrode G1 and the trench gate electrode G2 adjacent to each other in the active region AR.

Contact plugs CP formed so as to be embedded into concave portions defined in the upper surface of the semiconductor substrate SB are respectively coupled to the upper surfaces of the p$^+$-type semiconductor regions CC in the dummy region DR and the upper surfaces of the channel regions CH in the active region AR. Incidentally, the bottom of each contact plug CP reaches a depth on the way of each of the p$^+$-type semiconductor region CC and the channel region CH. An emitter electrode S1 is foamed between a trench gate electrode G1 and a contact plug CP adjacent to the trench gate electrode G1 at the upper surface of the channel region CH.

Incidentally, as with the structure shown in FIG. 5 although not shown in FIG. 15, an n-type semiconductor region DD may be formed directly below the channel region CH, or the p$^+$-type semiconductor region CC may be formed in the vicinity of the bottom face of each contact plug CP in the active region AR.

n$^+$-type semiconductor regions S2 which show the main feature of the semiconductor device according to the present embodiment are formed over the upper surfaces of the wells FW in the active region AR and the dummy region DR and arranged side by side in plural form in the Y direction as shown in FIGS. 12 and 14. Here, the n$^+$-type semiconductor regions S2 are arranged at positions where they are adjacent to the emitter electrodes S1 in the X direction.

As shown in FIGS. 16 and 17, the structure of the main IGBT cell MTC whose part is shown in an enlarged form is similar to that of the sense IGBT cell STC shown in FIGS. 14 and 15 except that the width of the dummy region DR in the X direction is small and no n$^+$-type semiconductor region S2 is formed over the upper surface of each well FW.

The operation of the sense IGBT of the present modification will next be described by mainly using FIG. 15. The EGE type IGBT of the present modification is an IGBT capable of obtaining an IE effect by arranging the trench gate electrodes G1 each applied with the gate voltage and the trench gate electrodes G2 each applied with the emitter voltage side by side.

When the EGE type IGBT is operated, a common gate voltage is applied to the trench gate electrode G1 (refer to FIG. 17) of the main IGBT cell MTC and the trench gate electrode G1 (refer to FIG. 15) of the sense IGBT cell STC. Further, a first emitter voltage is applied to the emitter electrode S1 and trench gate electrode G2 (refer to FIG. 17) of the main IGBT cell MTC. A second emitter voltage is applied to the emitter electrode S1 and trench gate electrode G2 (refer to FIG. 15) of the sense IGBT cell STC. Further, a common collector voltage is applied to the collector electrodes CE (refer to FIGS. 17 and 15) of the main IGBT cell MTC and the sense IGBT cell STC.

When the sense IGBT is operated, a part of electrons supplied from the contact plug CP in the active region AR shown in FIG. 15 flows into the collector electrode CE side through the emitter electrode S1, the channel region CH, and the drift layer DL.

Further, another part of the electrons supplied from the contact plug CP in the active region AR is moved through the emitter electrode S1, the channel region CH, and the drift layer DL in order. Thereafter, the electrons bypass the bottom of the trench gate electrode G1 and pass through the well FW and the n$^+$-type semiconductor region S2, followed by passing through the well FW and the drift layer to flow into the collector electrode CE side.

That is, there can be provided a current path in such a manner that the electrons are attracted to the upper surface side of the well FW by forming the n$^+$-type semiconductor region S2 and pass within the well FW. Thus, positive holes attracted from the collector electrode CE side are moved along a moving path of the electrons passing within the well FW and thereafter discharged from the channel region CH to the contact plug CP. Here, a part of the positive holes passing within the well FW remains within the well FW.

Thus, since the effect of accumulating the positive holes in the well FW is enhanced, conductivity modulation in the sense IGBT is accelerated (promoted). There is obtained an effect that since the conductivity modulation is accelerated in the outermost peripheral cell in the active region AR of the sense IGBT cell STC, i.e., the IGBT cell at the peripheral portion PP in particular, the bent waveform of such a graph as shown in FIG. 33 is improved. As a result, since the current normally flows even in the low current region in the sense IGBT cell STC, the sense ratio characteristic becomes a characteristic along the graph indicated by the broken line in FIG. 34.

Thus, since the relationship of magnitude between the current values of the sense IGBT and the main IGBT takes a relation according to the sense ratio, a collector current of the main IGBT can be calculated from a collector current of the sense IGBT even in the low current region. Accordingly, since it is possible to enlarge the current region which enables the current value of the main IGBT to be detected by the sense IGBT, the performance of the semiconductor device can be enhanced.

Also, in the present embodiment, no $n^+$-type semiconductor region S2 is provided over the upper surface of each well FW in the main IGBT cell MTC shown in FIGS. 13, 16, and 17. Therefore, it is possible to prevent a switching speed of the IGBT from being lowered and prevent a switching loss from occurring.

Further, in the present embodiment, the adoption of the EGE type enables prevention of an increase in the switching loss, a reduction in the switching speed, and destruction of the IGBT. That is, since the emitter voltage other than the gate voltage is applied to the trench gate electrode G2 shown in FIG. 15 and no emitter electrode S1 is provided in the region adjacent to the trench gate electrode G2, the positive holes accumulated in the well FW can efficiently be discharged from the contact plug CP between the adjacent trench gate electrodes G2 at the turning off of the IGBT. Also, an increase in conduction loss due to an increase in the capacitance between the gate and collector can be prevented by applying the emitter voltage other the gate voltage to the trench gate electrode G2, thus making it possible to speed up a switching operation. Further, it is possible to prevent destruction of the IGBT from occurring due to the excessive accumulation of the positive holes in the well FW.

Furthermore, even in the case where the dummy region of the sense IGBT cell is the same in width as the dummy region of the main IGBT cell although the present modification has described the case where the dummy region of the sense IGBT cell has the width larger than that of the dummy region of the main IGBT cell, a failure in operation in the low voltage region of the sense IGBT can be prevented by forming the $n^+$-type semiconductor region S2 over the upper surface of each well FW shown in FIG. 15. This is because even when only one cell at the outermost periphery of each of the sense IGBT cell and the main IGBT cell is formed as the dummy region DR, there is a case where the conductivity modulation in the low current region is hard to be shifted in the sense IGBT cell as compared with the main IGBT cell, and the normal current does not flow.

Incidentally, although the $n^+$-type semiconductor region S2 is formed even above the well FW in the dummy region DR here, the $n^+$-type semiconductor region S2 in the dummy region DR may not be formed. Further, the whole upper surface of the well FW may be covered with the $n^+$-type semiconductor region S2 as with the above modification 2.

<Modification 4>

Such an EGE type IGBT as described in the modification 3 is also capable of adopting the configuration in which no $n^+$-type semiconductor region S2 (refer to FIG. 18) is provided over the upper surface of the well at the central portion of the active region as in the modification 1.

Figure 18:
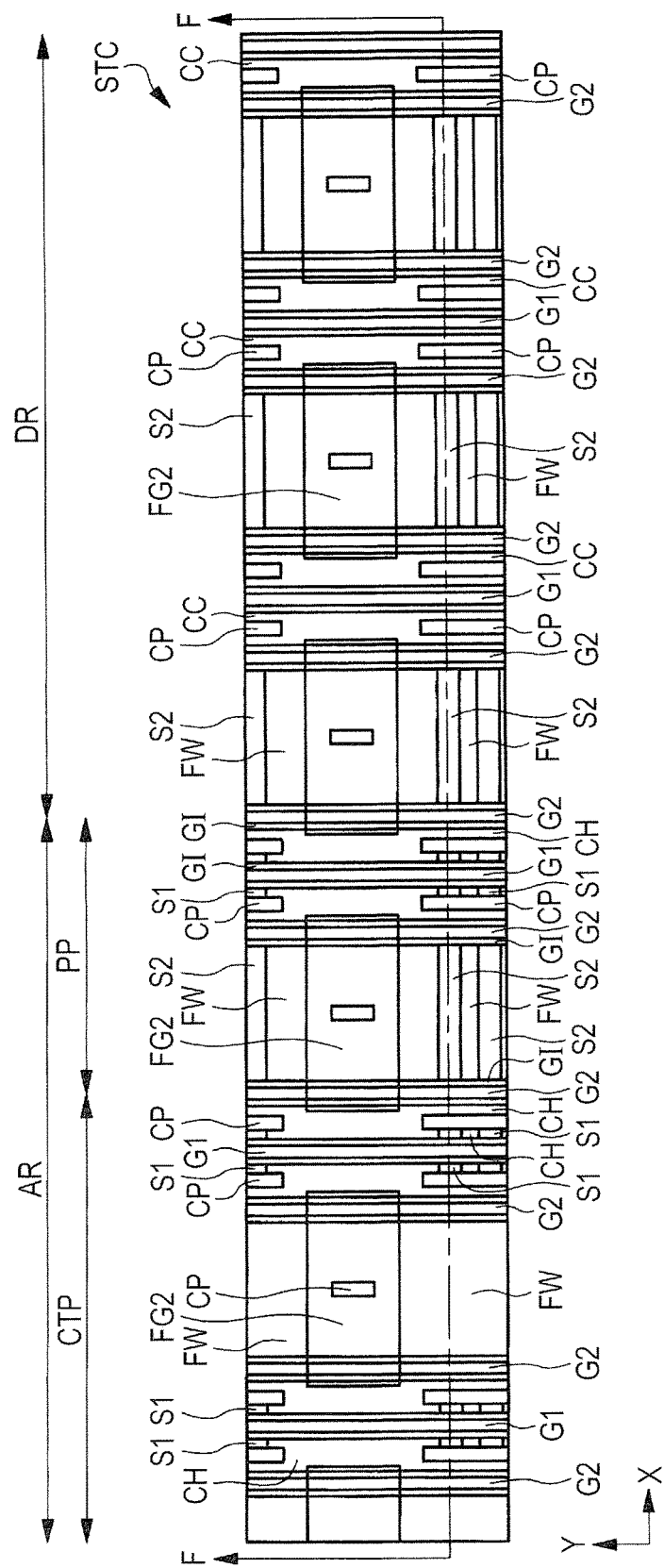
FIG. 18 is a plan diagram showing a sense IGBT cell which configures a semiconductor device according to a modification 4 of the embodiment 1 of the present invention.
Figure 19:
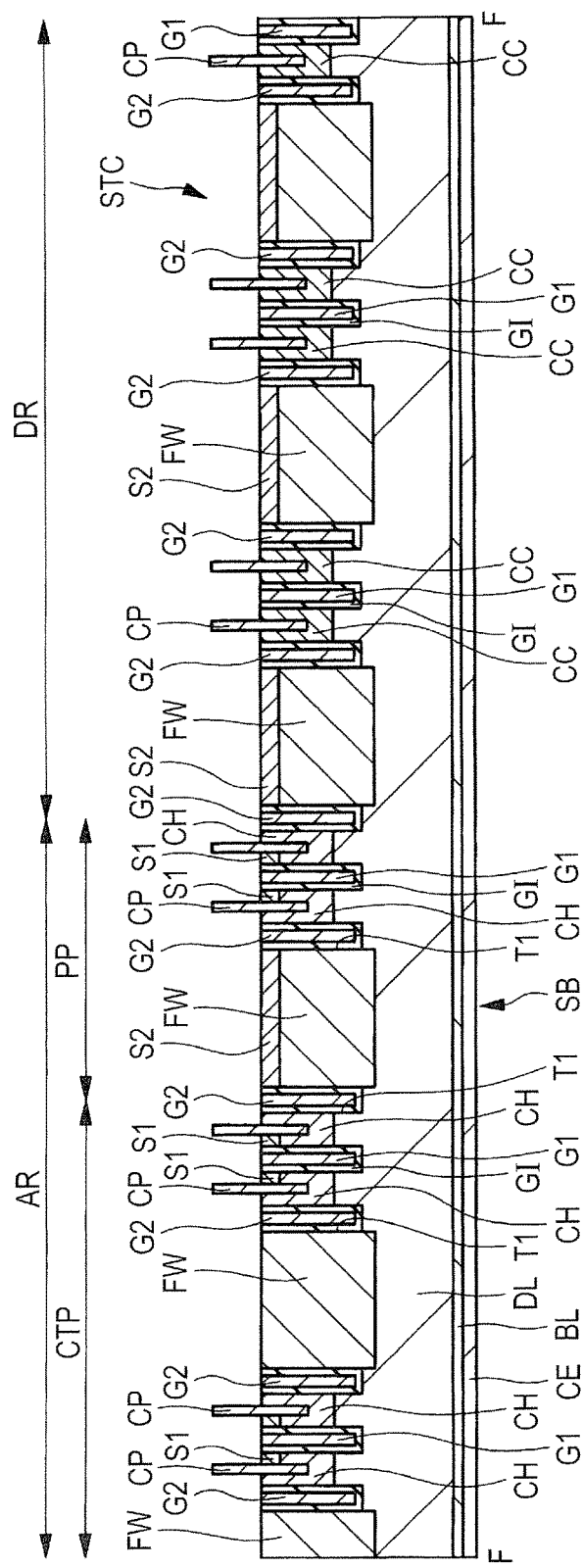
FIG. 19 is a sectional diagram taken along line F-F of FIG. 18.

A modification 4 of the semiconductor device according to the present embodiment will hereinafter be described using FIGS. 18 and 19. FIG. 18 is a plan diagram of the semiconductor device according to the modification 4 of the present embodiment. FIG. 19 is a sectional diagram of the semiconductor device according to the modification 4 of the present embodiment. FIG. 19 is a sectional diagram taken along line F-F of FIG. 18. FIGS. 18 and 19 respectively show the structure of a sense IGBT cell at a place corresponding to each of FIGS. 14 and 15.

The EGE type sense IGBT of the present modification has no $n^+$-type semiconductor region S2 over the upper surface of each well FW at a central portion CTP of an active region AR as shown in FIGS. 18 and 19. That is, the $n^+$-type semiconductor regions S2 are not formed in the central portion CTP corresponding to the major part of the upper surface of a semiconductor substrate SB in the sense IGBT cell STC. The $n^+$-type semiconductor regions S2 are formed only over the upper surfaces of wells FW in a peripheral portion PP of the active region AR and a dummy region DR. Other structures are similar to those of the semiconductor device described using FIGS. 12 through 17.

The present modification is capable of obtaining an effect similar to the modification 3. Further, when the $n^+$-type semiconductor regions S2 are provided at the central portion CTP of the sense IGBT cell STC, positive holes excessively remain in the well FW at the central portion CTP, and a long time is required to discharge the positive holes from within the well FW when the IGBT is turned off, thereby causing a problem that a reduction in switching speed and an increase in loss occur. On the other hand, since no $n^+$-type semiconductor regions S2 are provided at the central portion CTP in the present modification, it is possible to reduce the switching loss at the operation of the sense IGBT and enhance the switching speed.

Embodiment 2

A semiconductor device according to the present embodiment 2 will hereinafter be described using FIGS. 20 and 21. The semiconductor device according to the present embodiment is different from the semiconductor device according to the embodiment 2 and adapted to cause positive holes to be accumulated in a substrate by uncoupling of each contact plug to a pseudo IGBT in a dummy region.

Figure 20:
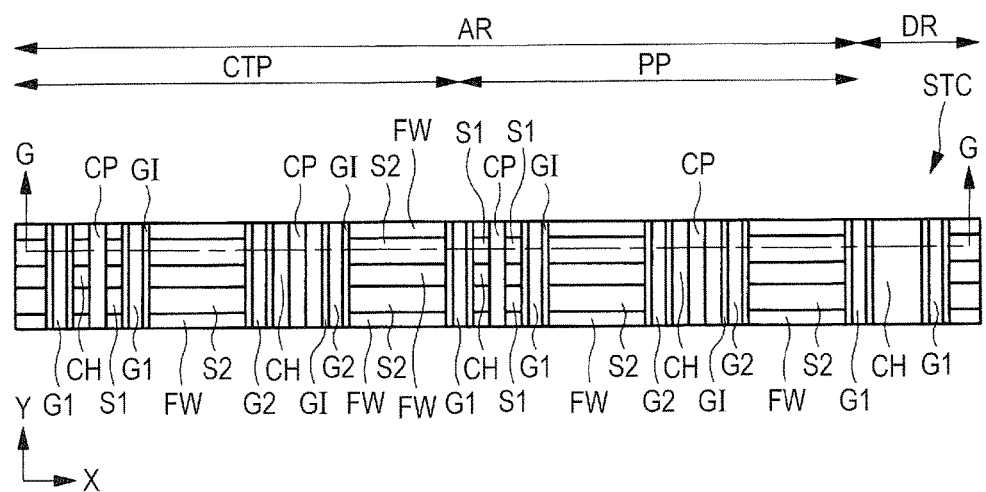
FIG. 20 is a plan diagram showing a sense IGBT cell which configures a semiconductor device according to an embodiment 2 of the present invention.

FIG. 20 is a plan diagram showing the semiconductor device according to the prelsent embodiment. FIG. 21 is a sectional diagram showing the semiconductor device according to the present embodiment. FIG. 21 is a sectional diagram taken along line G-G of FIG. 20. FIGS. 20 and 21 respectively show the structure of a sense IGBT cell at a place corresponding to each of FIGS. 4 and 5.

Figure 21:
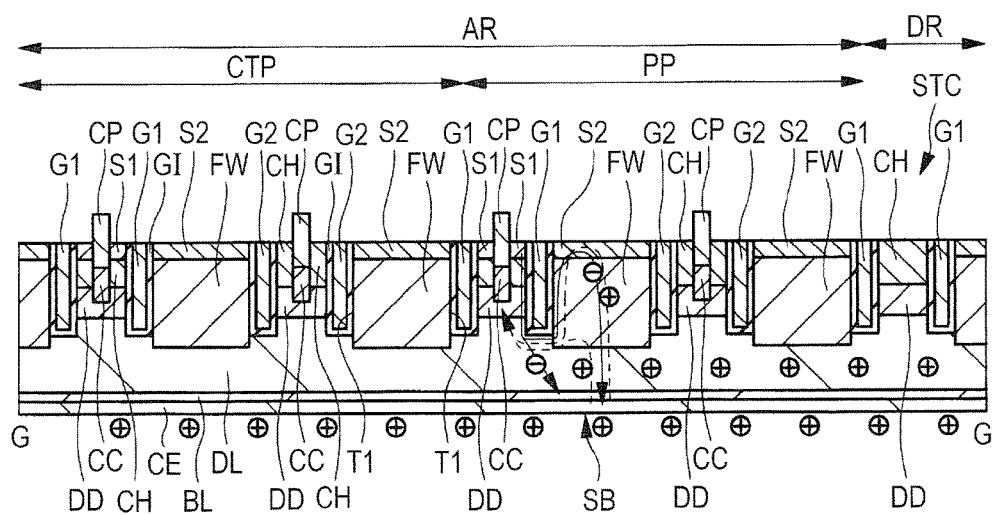
FIG. 21 is a sectional diagram taken along line G-G of FIG. 20.

As shown in FIGS. 20 and 21, the semiconductor device of the present embodiment has a structure almost similar to that of the semiconductor device according to the embodiment 1 described using FIGS. 1 through 7. The semiconductor device of the present embodiment differs from the semiconductor device of the embodiment 1 described using FIGS. 1 through 7 only in that no contact plug CP is coupled to a pseudo IGBT cell (dummy cell) in a dummy region DR.

That is, in an active region, AR, contact plugs CP are coupled to the main surface of a semiconductor substrate SB between trench gate electrodes G1 adjacent to each other and between trench gate electrodes G2 adjacent to each other respectively. On the other hand, no contact plug CP is coupled to the main surface of the semiconductor substrate SB between trench gate electrodes G1 adjacent to each other in the dummy region DR, i.e., the upper surface of a channel region CH. Further, in an unillustrated region, no contact plug CP is coupled to the main surface of the semiconductor substrate SB between trench gate electrodes G2 adjacent to each other in the dummy region DR, i.e., the upper surface of a channel region CH.

In other words, in the dummy region DR of the sense IGBT cell STC, the whole upper surface of the semiconductor substrate SB is in contact with the lower surface of an interlayer insulating film IL (refer to FIG. 7) lying over the semiconductor substrate SB between the trench gate electrodes G1 adjacent to each other and between the trench gate electrodes G2 adjacent to each other respectively. That is, no contact plug CP is formed directly above the semiconductor substrate SB between trenches T1 adjacent to each other in the dummy region DR of the sense IGBT cell STC. That is, in the dummy region DR of the sense IGBT cell STC, channel regions CH formed in the upper surface of the semiconductor substrate SB between the trench gate electrodes G1 adjacent to each other and between the trench gate electrodes G2 adjacent to each other respectively are respectively in a floating state.

Since no contact plug is coupled to the dummy cell in the semiconductor device of the present embodiment, there is no place where positive holes injected into the semiconductor substrate SB (e.g., drift layer DL) from the back surface side of the semiconductor substrate SB are discharged. That is, the positive holes are accumulated in the semiconductor substrate SB (e.g., drift layer DL) in the dummy region DR. Further, a part of the positive holes accumulated in the semiconductor substrate SB is attracted to electrons flowing through the $n^+$-type semiconductor region S2 and pass within each well FW once, after which they flow into the contact plug CP via an n-type semiconductor region DD. In this process, the part of the positive holes may also be accumulated in the well FW.

Thus, the positive holes accumulated in the semiconductor substrate SB (e.g., drift layer DL) in the dummy region DR, and the positive holes existing in the well FW are increased. As a result, there is obtained an effect that since conductivity modulation of a sense IGBT at a peripheral portion PP is accelerated, a bent waveform (refer to FIG. 33) of the sense IGBT is improved. That is, it is possible to obtain an effect similar to that of the embodiment 1 described using FIGS. 1 through 7.

Incidentally, as with the modification 1 of the embodiment 1, the $n^+$-type semiconductor region S2 may not be foamed in the central portion CTP of the sense IGBT cell STC. Further, as with the modification 2 of the embodiment 1, the whole upper surface of each well FW may be covered with the $n^+$-type semiconductor region S2.

Further, in a dummy region of a main IGBT cell, each contact plug is coupled to the main surface of the semiconductor substrate as with the embodiment 1.

<Modification>

The feature of the present embodiment that no contact plug is coupled to the dummy region can also be applied to the EGE type IGBT described in the modification 3 of the embodiment 1.

Figure 22:
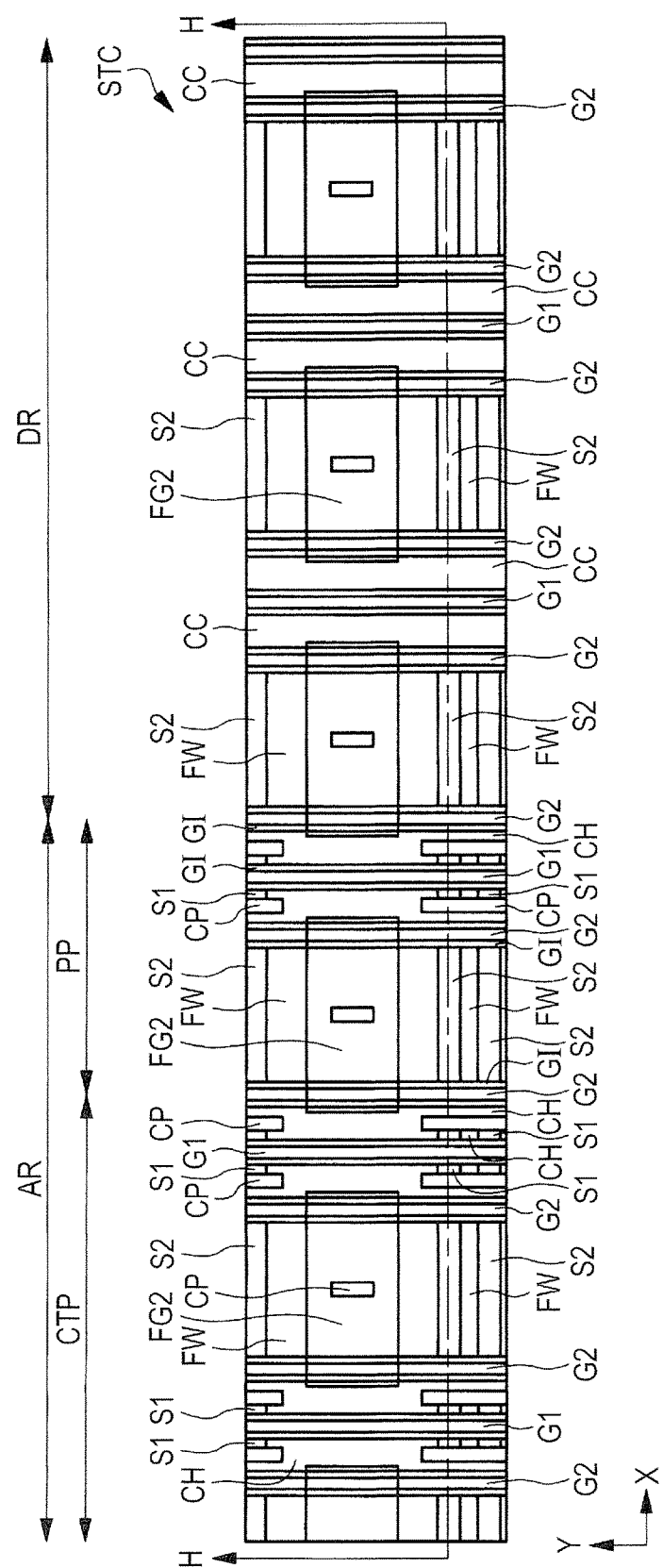
FIG. 22 is a plan diagram showing a sense IGBT cell which configures a semiconductor device according to a medication of the embodiment 2 of the present invention.
Figure 23:
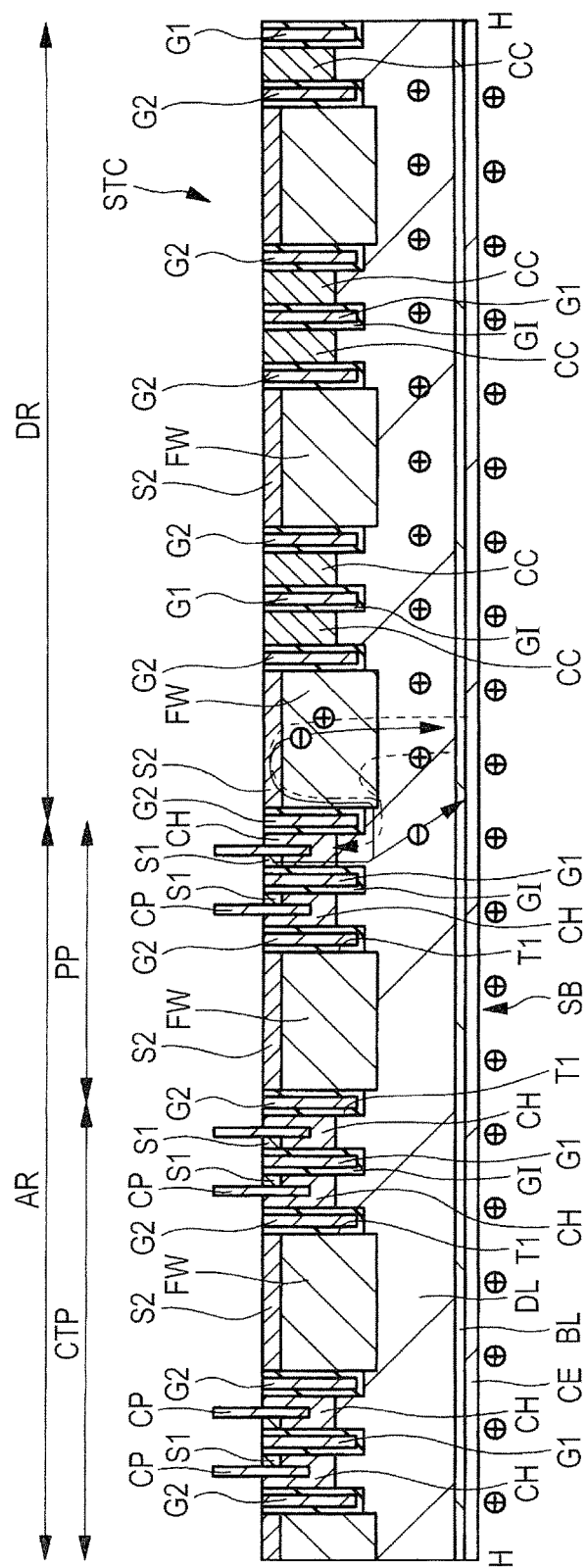
FIG. 23 is a sectional diagram taken along line H-H of FIG. 22.

A medication of the semiconductor device according to the present embodiment will hereinafter be described using FIGS. 22 and 23. FIG. 22 is a plan diagram of the semiconductor device according to the modification of the present embodiment. FIG. 23 is a sectional diagram of the semiconductor device according to the modification of the present embodiment. FIG. 23 is a sectional diagram taken along line H-H of FIG. 22. FIGS. 22 and 23 respectively show the structure of a sense IGBT cell at a place corresponding to each of FIGS. 14 and 15.

As shown in FIGS. 22 and 23, the semiconductor device of the present modification has a structure almost similar to that of the EGE type IGBT described in the modification 3 of the embodiment 1. The semiconductor device according to the present embodiment differs from the EGE type IGBT described in the modification 3 of the embodiment 1 only in that no contact plug CP is coupled to a pseudo IGBT cell (dummy cell) in a dummy region DR. That is, in the dummy region DR of the sense IGBT cell STC, no contact plug CP is coupled to the main surface of a semiconductor substrate SB between a trench gate electrode G1 and a trench gate electrode G2 adjacent to each other.

In the semiconductor device according to the present modification, positive holes injected into the semiconductor substrate SB are accumulated without being discharge by uncoupling of the contact plug to the dummy cell. Thus, there is obtained an effect that since conductivity modulation of a sense IGBT at a peripheral portion PP is accelerated by the accumulated positive holes, a bent waveform (refer to FIG. 33) of the sense IGBT is improved. That is, it is possible to obtain an effect similar to that of the IGBT of the modification 3 of the embodiment 1.

Incidentally, as with the modification 1 of the embodiment 1, an $n^+$-type semiconductor region S2 may not formed in a central portion CTP of the sense IGBT cell STC. Further, as with the modification 2 of the embodiment 1, the whole upper surface of each well FW may be covered with the $n^+$-type semiconductor region S2.

Embodiment 3

A semiconductor device according to the present embodiment 3 will hereinafter be described using FIGS. 24 and 25. The semiconductor device according to the present embodiment differs from the semiconductor device according to the embodiment 2 and is adapted to apply a gate voltage to all trench gate electrodes only in a peripheral portion of an active region in a sense IGBT cell and a dummy region to thereby change an electron flowing path and accumulate positive holes by a well. Incidentally, although a description will be made here about a case where no contact plug is coupled to a pseudo IGBT in a dummy region, as with the embodiment 2, the contact plug may be formed in the dummy region.

Figure 24:
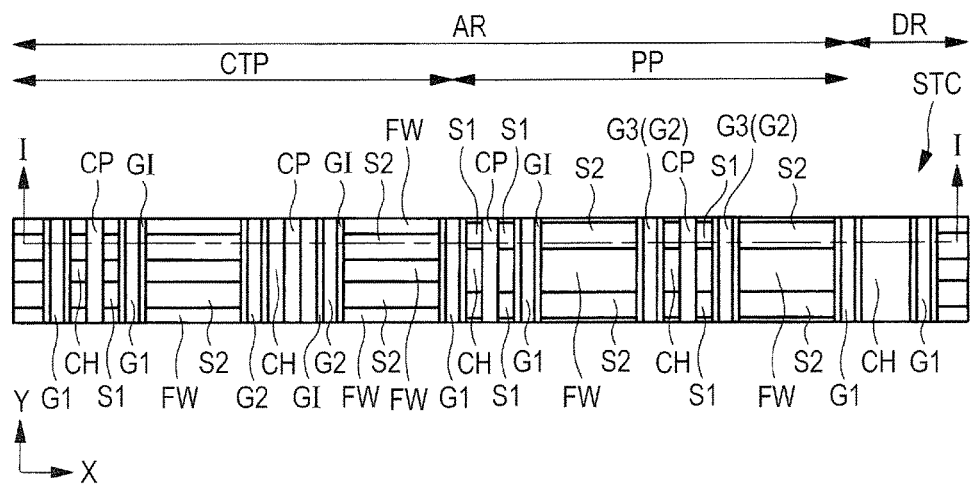
FIG. 24 is a plan diagram showing a sense IGBT cell which configures a semiconductor device according to an embodiment 3 of the present invention.

FIG. 24 is a plan diagram illustrating the semiconductor device according to the present embodiment. FIG. 25 is a sectional diagram illustrating the semiconductor device according to the present embodiment. FIG. 25 is a sectional diagram taken along line I-I of FIG. 24. FIGS. 24 and 25 respectively show the structure of a sense IGBT cell at a place corresponding to each of FIGS. 20 and 21.

Figure 25:
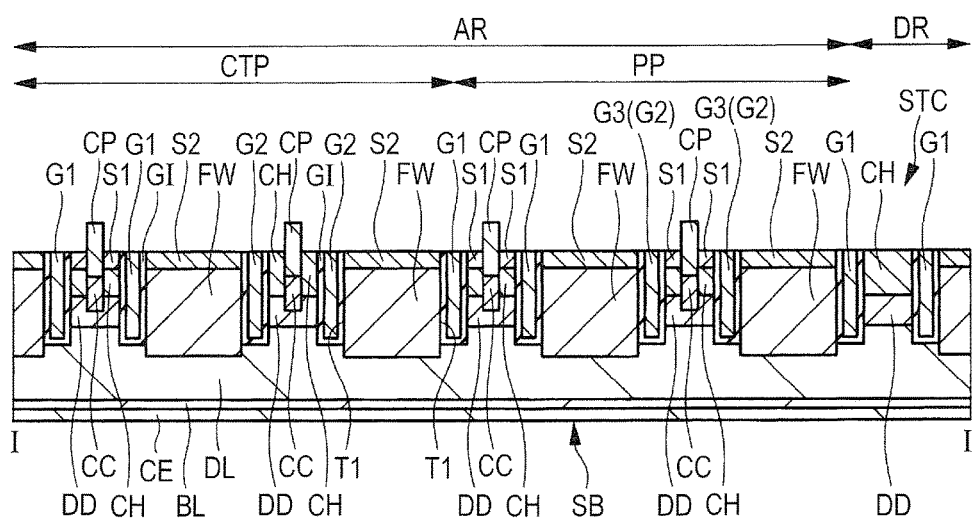
FIG. 25 is a sectional diagram taken along line I-I of FIG. 24.

As shown in FIGS. 24 and 25, the semiconductor device according to the present embodiment has a structure substantially similar to that of the semiconductor device according to the embodiment 2 described using FIGS. 1 through 7. The semiconductor device according to the present embodiment is however different from the semiconductor device according to the embodiment 2 described using FIGS. 1 through 7 in that upon the operation of a sense IGBT, a gate voltage is applied only to trench gate electrodes G2 formed in a peripheral portion PP of an active region AR and a dummy region DR, of all trench gate electrodes G2 fainted in a sense IGBT cell STC. Further, the semiconductor device according to the present embodiment differs from the semiconductor device according to the embodiment 2 in that emitter electrodes S1 are formed in the main surface of a semiconductor substrate SB between the trench gate electrodes G2 adjacent to each other at the peripheral portion PP. Other structures of the present embodiment are the same as those of the embodiment 2 described using FIGS. 1 through 7.

In the present embodiment, an emitter voltage is applied to each of the trench gate electrodes G2 at a central portion CTP as with the embodiments 1 and 2. Further, no emitter electrode S1 is formed between the trench gate electrodes G2 adjacent to each other at the central portion CTP. Moreover, the structure of an unillustrated main IGBT cell and a voltage applying condition at its operation are similar to those of the embodiments 1 and 2.

Here, for convenience, the trench gate electrode G2 applied with the gate voltage at the peripheral portion PP is also called a trench gate electrode G3. That is, at the peripheral portion PP and dummy region DR of the sense IGBT cell STC, two trench gate electrodes G1 and two trench gate electrodes G3 are alternately arranged in an X direction. Namely, since the gate voltage is applied to all the trench gate electrodes at the peripheral portion PP and the dummy region DR, each IGBT at the peripheral portion PP and the dummy region DR can be called a GG type IGBT.

That is, at the time of operation of each IGBT in the present embodiment, a common gate voltage is applied to each trench gate electrode G1 (refer to FIG. 7) of the main IGBT cell MTC, each trench gate electrode G1 (refer to FIG. 25) of the sense IGBT cell STC, and each trench gate electrode G3 (refer to FIG. 25) at the peripheral portion PP of the sense IGBT cell STC. Further, a first emitter voltage is applied to an emitter electrode S1 and a trench gate electrode G2 (refer to FIG. 7) of the main IGBT cell MTC. A second emitter voltage is applied to an emitter electrode S1 of the sense IGBT cell STC and a trench gate electrode G2 (refer to FIG. 25) at the central portion CTP. Further, a common collector voltage is applied to collector electrodes CE (refer to FIGS. 7 and 25) of the main IGBT cell MTC and the sense IGBT cell STC.

Since no contact plug CP is formed in the semiconductor substrate SB in the dummy region DR in the semiconductor device according to the present embodiment as with the embodiment 2, it is possible to accumulate positive holes in the semiconductor substrate SB.

Further, since the potentials of the trench gate electrodes G1 and G3 arranged over both side surfaces of each well FW at the peripheral portion PP are respectively fixed to a gate potential, an inversion layer ($n^+$ layer) is formed even at the outermost periphery of an active cell. That is, when an $n^+$-type semiconductor region S2 is formed over the upper surface of the well of each GGEE type IGBT, electrons passing within the well FW and the $n^+$-type semiconductor region S2 flow through a position away from the trench gate electrode G2 of emitter potential. On the other hand, since the IGBT at the peripheral portion PP of the sense IGBT cell STC in the present embodiment is a GG type and the gate voltage is applied to the trench gate electrode G2 (i.e., trench gate electrode G3), an inversion layer is formed even within the well FW in the vicinity of the trench gate electrode G3. Thus, the electrons flow even in the vicinity of the trench gate electrode G3 within the well FW.

Further, as with the embodiment 2, a part of positive holes having remained within the semiconductor substrate SB due to non-formation of the contact plug CP in the dummy region DR passes within the well FW without passing within the $n^+$-type semiconductor region S2 and is discharged from the contact plug CP via an n-type semiconductor region DD. As a result, in the well FW, the electrons flow in good balance over the whole thereof within the well FW inclusive of the vicinity of the trench gate electrode G1, the vicinity of the trench gate electrode G3, the middle part between the trench gate electrode G1 and the trench gate electrode G3, and the lower part of the well FW. Therefore, the positive holes are accumulated in the well FW in good balance.

Thus, an electron current via the inversion layer in the vicinity of the trench gate electrode G3 also slightly flows, so that the effect of accumulating the positive holes in the well FW at the peripheral portion PP is further enhanced to accelerate conductivity modulation. Thus, it is possible to obtain an effect that a bent waveform (refer to FIG. 33) of the sense IGBT is improved. That is, since the conductivity modulation is accelerated as compared with the embodiment 1 described using FIGS. 1 through 7, the performance of the semiconductor device can be enhanced.

Incidentally, when the emitter electrodes S1 are formed side by side at predetermined intervals in a Y direction as shown in FIG. 24, it is necessary to prevent a variation in the area of each emitter electrode S1 in the peripheral portion PP in such a manner that a sense ratio is not changed. To this end, here, the interval between the emitter electrodes S1 in the Y direction is adjusted at the peripheral portion PP having the GG type IGBT. That is, although the distance between the emitter electrodes S1 adjacent to each other in the Y direction is considered to be set to, for example, 0.44 µm in the GGEE type IGBT, the distance between the emitter electrodes S1 is required to be, for example, 0.88 µm because the number of the trench gate electrodes each applied with the gate voltage becomes twice that of the GGEE type IGBT. Thus, when the GGEE type IGBT is changed to the GG type IGBT, it is possible to prevent the effective area of emitter electrode S1 from varying and prevent a variation in the sense ratio.

Therefore, the interval between the emitter electrodes S1 arranged in the Y direction at the peripheral portion PP is larger than the interval between the emitter electrodes S1 arranged in the Y direction at the central portion CTP within the active region AR of the sense IGBT cell STC.

Further, as with the modification 1 of the embodiment 1, no $n^+$-type semiconductor region S2 may be formed in the central portion CTP of the sense IGBT cell STC. Moreover, the whole upper surface of each well FW may be covered with the $n^+$-type semiconductor region S2 as with the modification 2 of the embodiment 1.

<Modification 1>

Although the above embodiment described using FIGS. 24 and 25 is adapted to take the IGBT as the GG type only in the peripheral portion PP and the dummy region DR, the gate potential may be applied to all the trench gate electrode of the sense IGBT cell STC inclusive of the active region AR. That is, the sense IGBT may be changed from the GGEE type to the GG type.

Figure 26:
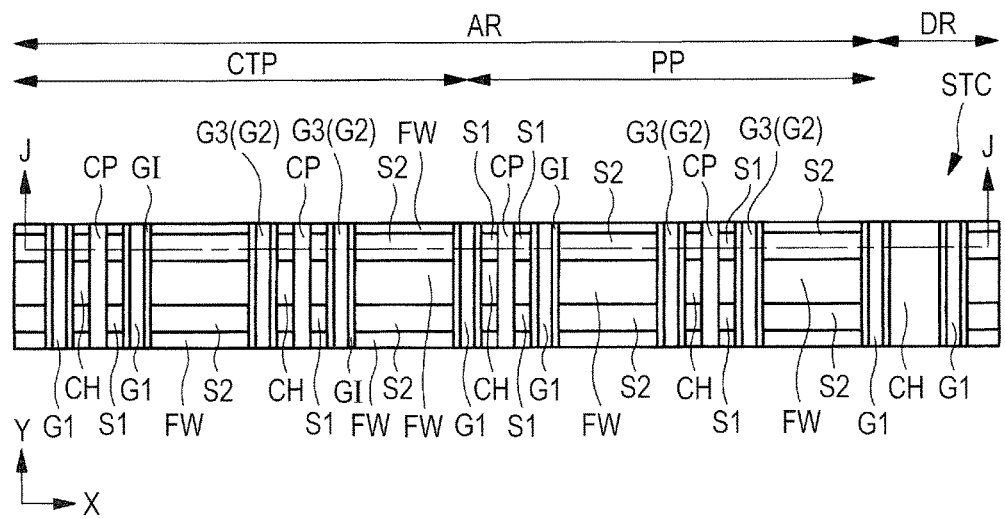
FIG. 26 is a plan diagram showing a sense IGBT cell which configures a semiconductor device according to a modification 1 of the embodiment 3 of the present invention.
Figure 27:
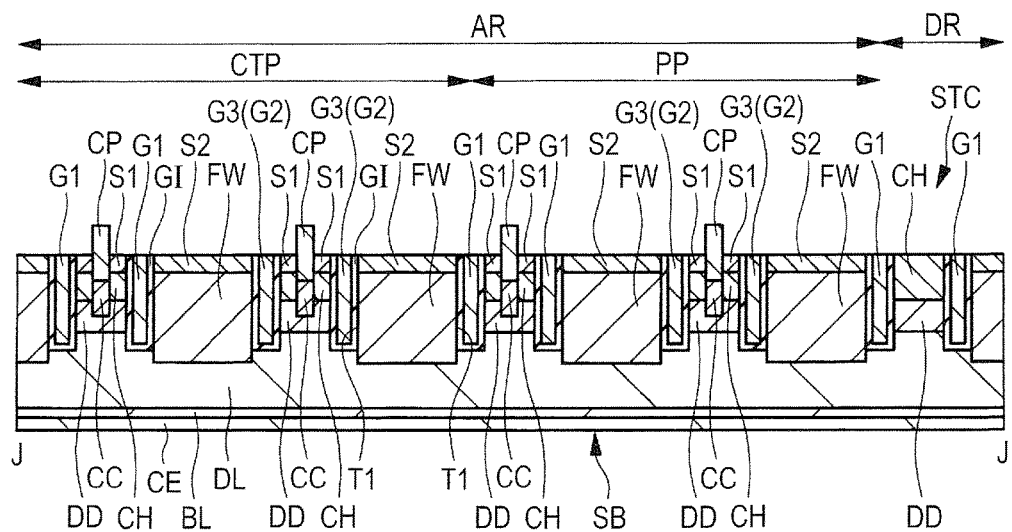
FIG. 27 is a sectional diagram taken along line J-J of FIG. 26.

A modification 1 of the semiconductor device according to the present embodiment will hereinafter be described using FIGS. 26 and 27. FIG. 26 is a plan diagram of the semiconductor device according to the modification 1 of the present embodiment. FIG. 27 is a sectional diagram of the semiconductor device according to the modification 1 of the present embodiment. FIG. 27 is a sectional diagram taken along line J-J of FIG. 26. FIGS. 26 and 27 respectively show the structure of a sense IGBT cell at a place corresponding to each of FIGS. 20 and 21.

As shown in FIGS. 26 and 27, the sense IGBT of the present modification is different from the sense IGBT described using FIGS. 24 and 25 in that upon the operation of the IGBT, a gate voltage is applied to all of trench gate electrodes G2 at a central portion CTP of an active region AR. That is, in all of the active region AR and dummy region DR of the sense IGBT cell STC, two trench gate electrodes G1 each applied with a gate voltage and two trench gate electrodes G2 (i.e., trench gate electrodes G3) each applied with a gate voltage are alternately arranged in an X direction. Further, the present modification differs from the sense IGBT described using FIGS. 24 and 25 in that emitter electrodes S1 are formed in the main surface of a semiconductor substrate SB between the trench gate electrodes G3 adjacent to each other at the central portion CTP. Other structures of the present modification are the same as those of the semiconductor device shown in FIGS. 24 and 25.

That is, when the IGBT in the present modification is operated, a common gate voltage is applied to trench gate electrodes G1 (refer to FIG. 7) of a main IGBT cell MTC, and the trench gate electrodes G1 and G3 (refer to FIG. 27) of the sense IGBT cell STC. Also, a first emitter voltage is applied to emitter electrodes S1 and trench gate electrodes G2 (refer to FIG. 7) of the main IGBT cell MTC, and a second emitter voltage is applied to emitter electrodes S1 (refer to FIG. 27) of the sense IGBT cell STC. Further, a common collector voltage is applied to a collector electrode CE (refer to FIGS. 7 and 27) of each of the main IGBT cell MTC and the sense IGBT cell STC.

In the semiconductor device according to the present modification as with the embodiment 2, positive holes injected into the semiconductor substrate SB are accumulated therein without being discharged by non-coupling of a contact plug to a dummy cell in the dummy region DR. Further, an electron current via an inversion layer in the vicinity of the trench gate electrode G3 also flows within each well FW in the active region AR, so that the effect of accumulating the positive holes in the well FW at a peripheral portion PP is further enhanced. Thus, it is possible to obtain an effect that a bent waveform (refer to FIG. 33) of the sense IGBT is improved by acceleration of conductivity modulation. That is, it is possible to obtain an effect similar to that of the semiconductor device shown in FIGS. 24 and 25.

Incidentally, when the emitter electrodes S1 are formed side by side at predetermined intervals in a Y direction as shown in FIG. 26, it is necessary to prevent a variation in the area of each emitter electrode S1 in the active region AR in such a manner that a sense ratio is not changed. To this end, here, the interval between the emitter electrodes S1 in the Y direction is adjusted in the whole sense IGBT cell STC. That is, although the distance between the emitter electrodes S1 adjacent to each other in the Y direction is considered to be set to, for example, 0.44 μm in the GGEE type IGBT, the distance between the emitter electrodes S1 is required to be, for example, 0.88 μm because the number of the trench gate electrodes each applied with the gate voltage becomes twice that of the GGEE type IGBT. Thus, when the GGEE type IGBT is changed to the GG type IGBT, it is possible to prevent the effective area of emitter electrode S1 from varying and prevent a variation in the sense ratio.

Further, as with the modification 1 of the embodiment 1, no n$^+$-type semiconductor region S2 may be formed in the central portion CTP of the sense IGBT cell STC. Moreover, the whole upper surface of each well FW may be covered with the n$^+$-type semiconductor region S2 as with the modification 2 of the embodiment 1.

<Modification 2>

As shown in FIGS. 24 and 25, the configuration of taking the IGBT at the peripheral portion PP as the GG type can be applied even to an IGBT in which three trench gate electrodes are provided between adjacent p-type wells each placed in a floating state, as in the EGE type IGBT.

Figure 28:
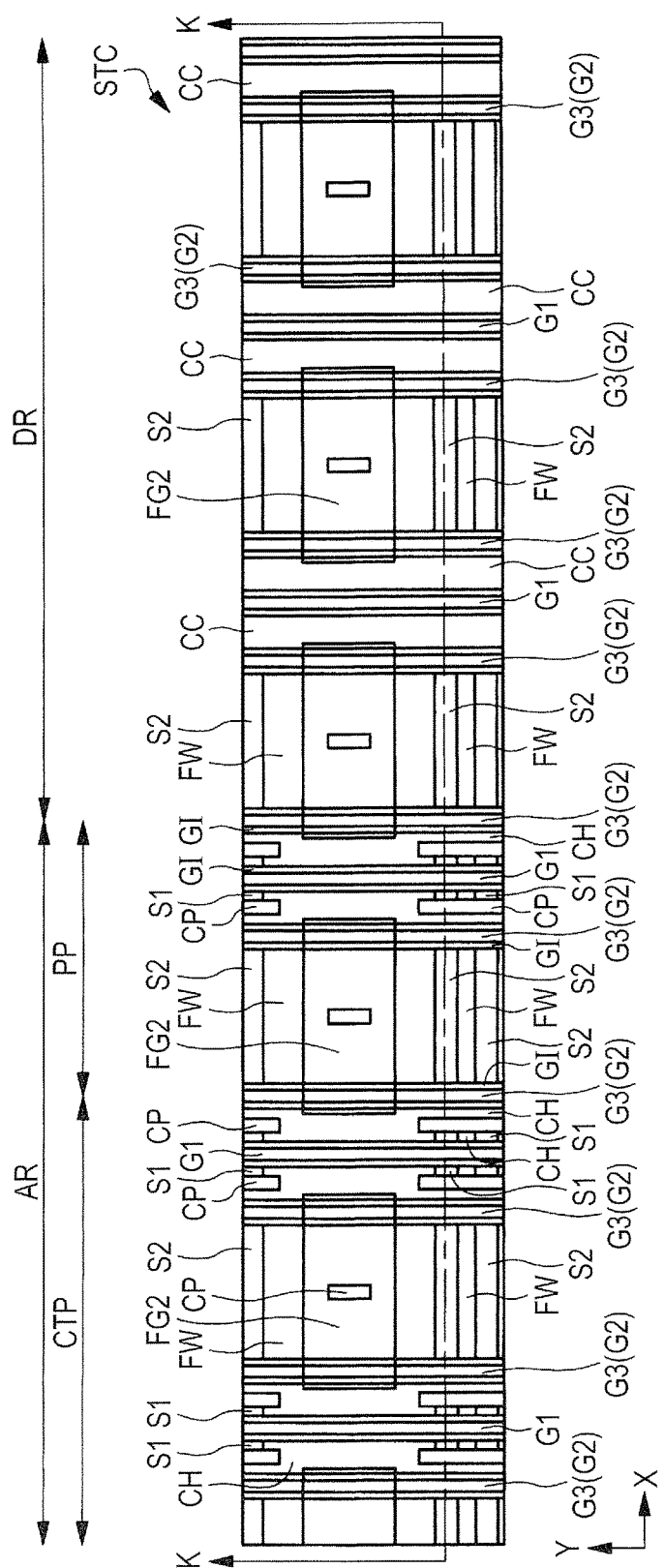
FIG. 28 is a plan diagram showing a sense IGBT cell which configures a semiconductor device according to a modification 2 of the embodiment 3 of the present invention.
Figure 29:
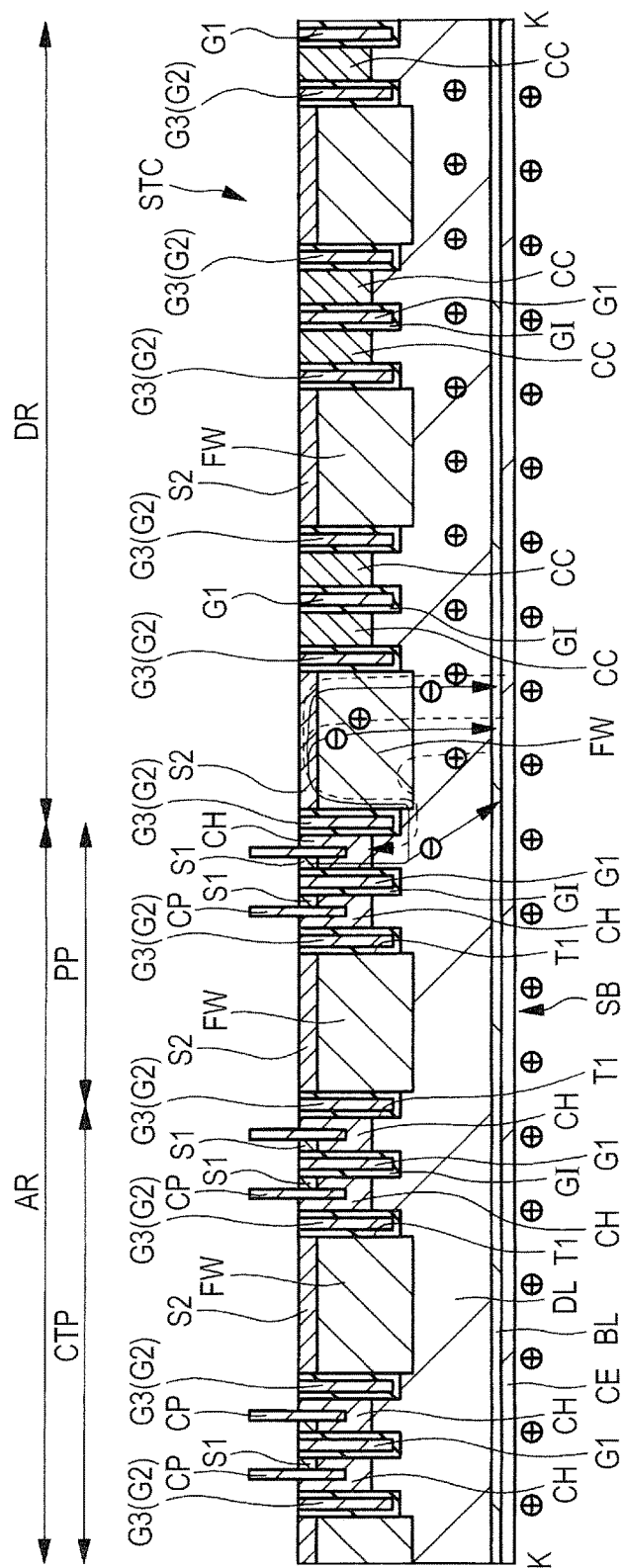
FIG. 29 is a sectional diagram taken along line K-K of FIG. 28.

A modification 2 of the semiconductor device according to the present embodiment will hereinafter be described using FIGS. 28 and 29. FIG. 28 is a plan diagram of the semiconductor device according to the modification 2 of the present embodiment. FIG. 29 is a sectional diagram of the semiconductor device according to the modification 2 of the present embodiment. FIG. 29 is a sectional diagram taken along line K-K of FIG. 28. FIGS. 28 and 29 respectively show the structure of a sense IGBT cell at a place corresponding to each of FIGS. 14 and 15.

As shown in FIGS. 28 and 29, a sense IGBT in the present modification has a structure almost similar to that of the EGE type sense IGBT described using FIGS. 14 and 15. The sense IGBT cell STC showing the modification of the present embodiment is however different from the EGE type sense IGBT described using FIGS. 14 and 15 in that upon the operation of the IGBT, a gate voltage is applied to trench gate electrodes G2 formed on both sides in the lateral direction of each of trench gate electrodes G1 in a peripheral portion PP and a dummy region DR as seen in an X direction. Further, the sense IGBT cell STC showing the modification of the present embodiment is different from the EGE type sense IGBT described using FIGS. 14 and 15 in that no contact plug CP is coupled to a semiconductor substrate SB in the dummy region DR.

In the present modification, an emitter voltage is applied to each trench gate electrode G2 at a central portion CTP in an active region AR unlike the trench gate electrodes G2 in the peripheral portion PP and the dummy region DR. Here, for convenience, the trench gate electrodes G2 each applied with the gate voltage in the peripheral portion PP and the dummy region DR are also called trench gate electrodes G3.

That is, at the time of operation of the IGBT in the present modification, a common gate voltage is applied to each trench gate electrode G1 (refer to FIG. 17) of the main IGBT cell MTC, and the trench gate electrodes G1 and G3 (refer to FIG. 29) of the sense IGBT cell STC. Further, a first emitter voltage is applied to an emitter electrode S1 and a trench gate electrode G2 (refer to FIG. 17) of the main IGBT cell MTC. A second emitter voltage is applied to each emitter electrode S1 (refer to FIG. 29) of the sense IGBT cell STC. Further, a common collector voltage is applied to collector electrodes CE (refer to FIGS. 17 and 29) of the main IGBT cell MTC and the sense IGBT cell STC.

In the present modification as with the embodiment 2, positive holes injected into the semiconductor substrate SB are accumulated therein without being discharged by non-coupling of a contact plug to a dummy cell in the dummy region DR. Further, an electron current via an inversion layer in the vicinity of the trench gate electrode G3 also flows within each well FW in the active region AR, so that the effect of accumulating the positive holes in the well FW at the peripheral portion PP is further enhanced. Thus, it is possible to obtain an effect that a bent waveform (refer to FIG. 33) of the sense IGBT is improved by acceleration of conductivity modulation.

Although not shown in FIGS. 28 and 29, the emitter electrode S1 may be formed in the main surface of the semiconductor device SB between the contact plug CP and the trench gate electrode G3 adjacent to each other in the X direction. In such a case, in order to prevent a variation in sense ratio due to a variation in the area of the emitter electrodes S1 in the whole active region AR, it is necessary to take measures such as an increase in the interval between the emitter electrodes S1 adjacent to each other in a Y direction, for example.

Further, as with the modification 1 of the embodiment 1, no n$^+$-type semiconductor region S2 may be formed in the central portion CTP of the sense IGBT cell STC. Moreover, as with the modification 2 of the embodiment 1, the whole upper surface of each well FW may be covered with the n$^+$-type semiconductor region S2.

Incidentally, although the present modification has described the case where at both the central portion CTP and the peripheral portion PP in the active region AR, the gate voltage is applied to the trench gate electrodes G1 and G2 (G3), the gate voltage may be applied to the trench gate electrodes G2 (G3) at the peripheral portion PP, and the emitter voltage may be applied to the trench gate electrodes G2 at the central portion CTP, as with the sense IGBT described using FIGS. 24 and 25.

Although the invention made above by the present inventors has been described specifically on the basis of the embodiments, the present invention is not limited to the embodiments referred to above. It is needless to say that various changes can be made thereto within the scope not departing from the gist thereof.

What is claimed is:

1. A semiconductor device comprising:
    a semiconductor substrate;
    a plurality of first IGBTs formed in a main energizing region of the semiconductor substrate;
    a plurality of second IGBTs formed in a sub-energizing region of the semiconductor substrate;
    a plurality of pseudo third IGBTs, which do not configure a circuit, formed in a first region around the main energizing region; and
    a plurality of pseudo fourth IGBTs, which do not configure a circuit, formed in a second region around the sub-energizing region,
    wherein the sub-energizing region is smaller than the main energizing region in area in plan view,
    wherein a plurality of first p-type wells of a floating state are formed in a main surface of the semiconductor substrate, each first p-type well being adjacent to a first trench gate electrode which configures a respective one of the first IGBTs,
    wherein a plurality of second p-type wells of a floating state are formed in the main surface of the semiconductor substrate, each second p-type well being adjacent to a second trench gate electrode which configures a respective one of the second IGBTs at an end of the sub-energizing region,
    wherein an n-type semiconductor region is formed over an upper surface of each of the second p-type wells, and
    wherein a number of the pseudo fourth IGBTs arranged in the second region in a lateral direction of the second trench gate electrodes is larger than a number of the pseudo third IGBTs arranged in the first region in a lateral direction of the first trench gate electrodes.

2. The semiconductor device according to claim 1,
    wherein the main energizing region includes first unit cells arranged side by side in plural form, each comprising:
        a plurality of first trenches formed in the main surface of the semiconductor substrate and extending along the main surface of the semiconductor substrate,
        the first trench gate electrode of each first IGBT formed a respective one of the first trenches through a first insulating film,
        a plurality of first emitter electrodes formed in the main surface of the semiconductor substrate, each first emitter electrode being adjacent to a respective one of the first trenches in a lateral direction of the first trenches,
        a p-type collector electrode formed in a back surface of the semiconductor substrate on a side opposite to the main surface thereof,
        a plurality of first p-type semiconductor regions, each being adjacent to a respective one of the first trenches and directly under a respective one of the first emitter electrodes, and
        the plurality of first p-type wells formed in the main surface of the semiconductor substrate, each of the first p-type wells being adjacent to a respective one of the first trenches on an opposite side from a respective one of the first emitter electrodes in the lateral direction of the first trenches, and
    wherein the sub-energizing region includes second unit cells arranged side by side in plural form, each comprising:
        at least one second trench formed in the main surface of the semiconductor substrate and extending along the main surface of the semiconductor substrate,
        the second trench gate electrode of each second IGBT formed within a respective one of the second trenches through a second insulating film,
        a plurality of second emitter electrodes formed in the main surface of the semiconductor substrate, each second emitter electrode being adjacent to a respective one of the second trenches in a lateral direction of the second trenches,
        the p-type collector electrode,
        a plurality of second p-type semiconductor regions, each being adjacent to a respective one the second trenches and directly under a respective one of the second emitter electrodes, and
        the plurality of second p-type wells formed in the main surface of the semiconductor substrate, each second p-type well being adjacent to a respective one of the second trenches on an opposite side from a respective one of the second emitter electrodes in the lateral direction of the second trenches.

3. The semiconductor device according to claim 2,
    wherein each first IGBT is configured by one of the first trench gate electrodes, one of the first emitter electrodes, one of the first p-type semiconductor regions, and the p-type collector electrode,
    wherein each second IGBT is configured by one of the second trench gate electrodes, one of the second emitter electrodes, one of the second p-type semiconductor regions, and the p-type collector electrode,
    wherein each first trench gate electrode and each second trench gate electrode are electrically coupled to each other, and
    wherein a sub element group including the second IGBTs is used to detect a main current flowing through a main element group including the first IGBTs in the main energizing region, based on a sub current flowing through the sub-energizing region.

4. The semiconductor device according to claim 1,
    wherein, in the end of the sub-energizing region, the n-type semiconductor region is formed over an upper surface of each second p-type well, and
    wherein, in a central portion of the sub-energizing region away from the end of the sub-energizing region in plan view, the n-type semiconductor region is not formed over an upper surface of another p-type wells of a floating state, each of which are adjacent to a second gate electrode that configures a respective one of the second IGBTs in said central portion.

5. The semiconductor device according to claim 1,
    wherein a third p-type well is formed in the main surface of the semiconductor substrate adjacent to another trench gate electrode, which configures one of the pseudo fourth IGBTs, in a lateral direction of the another trench gate electrode, and wherein a third p-type semiconductor region, which is formed in the main surface of the semiconductor substrate adjacent to the first another trench gate electrode that configures said one of the pseudo fourth IGBTs and on an opposite side from the third p-type well in the lateral direction of the another trench gate electrode, is in a floating state.

6. The semiconductor device according to claim 2,
wherein each second unit cell in the sub-energizing region includes two said second trenches and two third trenches extending along a longitudinal direction of the second trenches, the second and third trenches being alternately arranged in the lateral direction of the second trenches,
wherein each second unit cell in the sub-energizing region further has third trench gate electrodes respectively formed through a third insulating film within the third trench formed in the main surface of the semiconductor substrate, and contact plugs respectively coupled to the main surface of the semiconductor substrate adjacent to the third trenches in a lateral direction of the third trenches and n the on an opposite side from one of the second p-type wells between one of the second trench gate electrodes and an adjacent one of the third trench gate electrodes, and
wherein when the first IGBTs and the second IGBTs are operated, a gate voltage is applied to the first trench gate electrodes and the second trench gate electrodes, a first emitter voltage is applied to the first emitter electrodes, and a second emitter voltage is applied to the second emitter electrodes and the third trench gate electrodes.

7. The semiconductor device according to claim 2,
wherein each second unit cell in the sub-energizing region includes two said second trenches and two third trenches extending along a longitudinal direction of the second trenches, the second and third trenches being alternately arranged in a lateral direction of the second trenches,
wherein each second unit cell in the sub-energizing region further has third trench gate electrodes respectively formed through a third insulating film within the third trenches formed in the main surface of the semiconductor substrate, and contact plugs respectively coupled to the main surface of the semiconductor substrate adjacent to the third trenches in a lateral direction of the third trenches and on an opposite side from one of the second p-type wells between one of the second trench gate electrodes and an adjacent one of the third trench gate electrodes, and
wherein when the first IGBTs and the second IGBTs are operated, a gate voltage is applied to the first trench gate electrodes, the second trench gate electrodes, and the third trench gate electrodes in a third region being the end within the sub-energizing region, a first emitter voltage is applied to the first emitter electrodes, and a second emitter voltage is applied to the second emitter electrodes and the third trench gate electrodes in a fourth region surrounded by the third region within the sub-energizing region.

8. The semiconductor device according to claim 2,
wherein each second unit cell in the sub-energizing region includes two said second trenches and two third trenches extending along a longitudinal direction of the second trenches, the second and third trenches being alternately arranged in a lateral direction of the second trenches,
wherein each second unit cell in the sub-energizing region further has third trench gate electrodes respectively formed through a third insulating film within the third trenches formed in the main surface of the semiconductor substrate, and
wherein when the first IGBTs and the second IGBTs are operated, a gate voltage is applied to the first trench gate electrodes, the second trench gate electrodes, and the third trench gate electrodes in the sub-energizing region, a first emitter voltage is applied to the first emitter electrodes, and a second emitter voltage is applied to the second emitter electrodes.

9. The semiconductor device according to claim 2,
wherein each second unit cell in the sub-energizing region includes one said second trench and two third trenches extending along a longitudinal direction of the second trench, the second and third trenches being alternately arranged in a lateral direction of the second trench,
wherein each second unit cell in the sub-energizing region further has third trench gate electrodes respectively formed through a third insulating film within the third trenches formed in the main surface of the semiconductor substrate,
wherein each of the third trench gate electrodes is arranged between the second trench and one of the second p-type wells,
wherein each second p-type well is arranged between one of the third trench gate electrodes and one of the third trench gate electrodes of another second unit cell adjacent in a lateral direction of the third trenches, and
wherein when the first IGBTs and the second IGBTs are operated, a gate voltage is applied to the first trench gate electrodes and the second trench gate electrode, a first emitter voltage is applied to the first emitter electrodes, and a second emitter voltage is applied to the second emitter electrodes and the third trench gate electrodes.

10. The semiconductor device according to claim 2,
wherein each second unit cell in the sub-energizing region includes one said second trench and two third trenches extending along a longitudinal direction of the second trench, the second and third trenches being alternately arranged in a lateral direction of the second trench,
wherein each second unit cell in the sub-energizing region further has third trench gate electrodes respectively formed through a third insulating film within the third trenches formed in the main surface of the semiconductor substrate,
wherein each third trench gate electrode is arranged between the second trench and one of the second p-type wells,
wherein each second p-type well is arranged between one of the third trench gate electrodes and one of the third trench gate electrodes of another second unit cell adjacent in a lateral direction of the third trenches, and
wherein when the first IGBTs and the second IGBTs are operated, a gate voltage is applied to the first trench gate electrodes, the second trench gate electrode, and the third trench gate electrodes in a third region being the end within the sub-energizing region, a first emitter voltage is applied to the first emitter electrodes, and a second emitter voltage is applied to the second emitter electrodes and the third trench gate electrodes in a fourth region surrounded by the third region within the sub-energizing region.

11. The semiconductor device according to claim 2,
wherein each second unit cell in the sub-energizing region includes one said second trench and two third trenches extending along a longitudinal direction of the second trench, the second and third trenches being alternately arranged in the lateral direction of the second trench,
wherein each second unit cell in the sub-energizing region further has third trench gate electrodes respectively formed through a third insulating film within the third trenches formed in the main surface of the semiconductor substrate,
wherein each third trench gate electrode is arranged between the second trench and one of the second p-type wells,
wherein each second p-type well is arranged between one of the third trench gate electrodes and one of the third trench gate electrodes of another second unit cell adjacent in a lateral direction of the third trenches, and
wherein when the first IGBTs and the second IGBTs are operated, a gate voltage is applied to the first trench gate electrodes, the second trench gate electrode, and the third trench gate electrodes in the sub-energizing region, a first emitter voltage is applied to the first emitter electrodes, and a second emitter voltage is applied to the second emitter electrodes.

12. The semiconductor device according to claim 1,
wherein each first IGBT has a first emitter electrode formed in the main surface of the semiconductor substrate adjacent to the corresponding first trench gate electrode,
wherein each second IGBT has a second emitter electrode formed in the main surface of the semiconductor substrate adjacent to the corresponding second trench gate electrode, and
wherein a width of the n-type semiconductor region is larger than a width of each second emitter electrode in a longitudinal direction of the second trench gate electrodes extending along the main surface of the semiconductor substrate.

13. The semiconductor device according to claim 1,
wherein each first IGBT has a first emitter electrode formed in the main surface of the semiconductor substrate adjacent to the corresponding first trench gate electrode,
wherein each second IGBT has a second emitter electrode formed in the main surface of the semiconductor substrate adjacent to the corresponding second trench gate electrode, and
wherein each second emitter electrode and each n-type semiconductor region are arranged so as to interpose the corresponding second trench gate electrode therebetween in a lateral direction of the second trench gate electrodes extending along the main surface of the semiconductor substrate.

14. The semiconductor device according to claim 1,
wherein a floating n-type semiconductor region is not formed over an upper surface of the first p-type wells in the main energizing region.

* * * * *